(12) United States Patent
Lee et al.

(10) Patent No.: US 11,315,978 B2
(45) Date of Patent: Apr. 26, 2022

(54) IMAGE SENSOR AND METHOD OF MANUFACTURING THE SAME

(71) Applicant: Samsung Electronics Co., Ltd., Suwon-si (KR)

(72) Inventors: Kwang-Min Lee, Seoul (KR); Seokjin Kwon, Seoul (KR); Hyeyun Park, Hwaseong-si (KR); Beomsuk Lee, Yongin-si (KR); Dongmo Im, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 16/857,839

(22) Filed: Apr. 24, 2020

(65) Prior Publication Data
US 2020/0251521 A1   Aug. 6, 2020

Related U.S. Application Data

(63) Continuation of application No. 15/813,843, filed on Nov. 15, 2017, now Pat. No. 10,651,226.

(30) Foreign Application Priority Data

Jan. 5, 2017 (KR) .................. 10-2017-0001940

(51) Int. Cl.
*H01L 27/146* (2006.01)
*H04N 5/374* (2011.01)

(52) U.S. Cl.
CPC .. *H01L 27/14645* (2013.01); *H01L 27/14612* (2013.01); *H01L 27/14621* (2013.01); *H01L 27/14627* (2013.01); *H01L 27/14636* (2013.01); *H01L 27/14689* (2013.01); *H04N 5/374* (2013.01)

(58) Field of Classification Search
None
See application file for complete search history.

(56) References Cited

U.S. PATENT DOCUMENTS

| 8,138,533 B2 * | 3/2012 | Koike ............. H01L 27/1464 257/292 |
|---|---|---|
| 8,212,328 B2 | 7/2012 | Pyo |
| 8,368,784 B2 | 2/2013 | Yamaguchi |
| 8,564,701 B2 | 10/2013 | Watanabe et al. |

(Continued)

FOREIGN PATENT DOCUMENTS

| JP | 2017157816 A | 9/2016 |
|---|---|---|
| JP | 6012262 | 10/2016 |

(Continued)

*Primary Examiner* — Nishath Yasmeen
(74) *Attorney, Agent, or Firm* — Harness, Dickey & Pierce, P.L.C.

(57) ABSTRACT

An image sensor includes a substrate having a first surface and a second surface opposite to each other, a first floating diffusion region provided in the substrate and being adjacent to the first surface, a through-electrode provided in the substrate and electrically connected to the first floating diffusion region, an insulating structure, a bottom electrode, a photoelectric conversion layer, and a top electrode sequentially stacked on the second surface, a color filter buried in the insulating structure, and a top contact plug penetrating the insulating structure to connect the bottom electrode to the through-electrode.

20 Claims, 16 Drawing Sheets

(56) References Cited

U.S. PATENT DOCUMENTS

| | | | |
|---|---|---|---|
| 8,704,924 B2 | 4/2014 | Watanabe et al. | |
| 8,921,901 B1 | 12/2014 | Kao | |
| 9,048,354 B2 | 6/2015 | Park et al. | |
| 9,136,163 B2 | 9/2015 | Kumano | |
| 9,698,188 B2 * | 7/2017 | Togashi | H04N 5/379 |
| 2013/0168750 A1 * | 7/2013 | Ikhlef | H01L 27/14698 |
| | | | 257/292 |
| 2013/0307040 A1 * | 11/2013 | Ahn | H01L 27/1463 |
| | | | 257/292 |
| 2014/0246707 A1 * | 9/2014 | Koo | H01L 27/14614 |
| | | | 257/230 |
| 2015/0372036 A1 * | 12/2015 | Suh | H01L 27/14609 |
| | | | 348/273 |
| 2016/0056200 A1 * | 2/2016 | Lee | H01L 27/1464 |
| | | | 250/208.1 |
| 2016/0204142 A1 * | 7/2016 | Um | H01L 27/1463 |
| | | | 257/446 |

FOREIGN PATENT DOCUMENTS

| | | | |
|---|---|---|---|
| KR | 2013-0134162 A | | 12/2013 |
| WO | WO2015/025723 | * | 8/2013 |
| WO | WO2015/025723 | * | 2/2015 |
| WO | WO-2015/025723 A1 | | 2/2015 |

* cited by examiner

IMAGE SENSOR AND METHOD OF MANUFACTURING THE SAME

CROSS-REFERENCE TO RELATED APPLICATION

This U.S. non-provisional patent application is a continuation of U.S. application Ser. No. 15/813,843, filed on Nov. 15, 2017, which claims priority under 35 U.S.C. § 119 to Korean Patent Application No. 10-2017-0001940, filed on Jan. 5, 2017, in the Korean Intellectual Property Office, the disclosure of each of which are hereby incorporated by reference in their entirety.

BACKGROUND

Embodiments of inventive concepts relate to an image sensor and a method of manufacturing the same and, more particularly, to an image sensor including an organic photoelectric conversion layer and a method of manufacturing the same.

An image sensor may convert an optical image into electrical signals. Image sensors may be categorized as a charge coupled device (CCD) image sensors or complementary metal-oxide-semiconductor (CMOS) image sensors (CIS). The CIS may include a plurality of pixels arranged two-dimensionally. Each of, or at least one of, the pixels may include a photodiode. The photodiode may be configured to convert incident light into an electrical signal.

SUMMARY

Embodiments of inventive concepts may provide an image sensor capable of improving an integration density.

Embodiments of inventive concepts may also provide a method of manufacturing an image sensor with an improved integration density.

According to an example embodiment, an image sensor may include a substrate having a first surface and a second surface opposite to the first surface, a first floating diffusion region in the substrate, the first floating diffusion region adjacent to the first surface, a through-electrode in the substrate, the through-electrode electrically connected to the first floating diffusion region, an insulating structure, a bottom electrode, a photoelectric conversion layer, and a top electrode sequentially stacked on the second surface, a color filter buried in the insulating structure, and a top contact plug penetrating the insulating structure, the top contact plug connecting the bottom electrode to the through-electrode.

According to an example embodiment, an image sensor may include a substrate having a first surface and a second surface opposite one another the first surface, the substrate including pixel regions extending in a first direction, first and second deep device isolation patterns in the substrate, the first and second deep device isolation patterns including first and second extensions extending in the first direction, respectively, the first and second extensions being spaced apart from one another with the pixel regions therebetween, through-electrodes in the substrate, the through-electrodes between the pixel regions when viewed in a plan view, an insulating structure, a photoelectric conversion layer, and a top electrode sequentially provided on the second surface, bottom electrodes between the insulating structure and the photoelectric conversion layer, top contact plugs in the insulating structure to connect the bottom electrodes to the through-electrodes, respectively, and color filters buried in the insulating structure.

According to an example embodiment, a method of manufacturing an image sensor may include providing a substrate having a first surface and a second surface opposite to one another, forming a through-electrode in the substrate, forming an insulating layer on the second surface, forming a top contact plug penetrating the insulating layer, the top contact plug connecting to the through-electrode, burying a color filter in the insulating layer, and sequentially forming a bottom electrode, a photoelectric conversion layer, and a top electrode on the insulating layer. The bottom electrode is connected to the top contact plug.

According to an example embodiment, a CMOS image sensor may include a substrate including a first surface and a second surface opposite the first surface, a transfer gate on the first surface of the substrate, a micro lens on the second surface of the substrate, and a through-electrode in the substrate, the through-electrode extending from the first surface of the substrate to the second surface of the substrate, the through-electrode including doped poly-silicon.

BRIEF DESCRIPTION OF THE DRAWINGS

Inventive concepts will become more apparent in view of the attached drawings and accompanying detailed description.

DETAILED DESCRIPTION OF THE EMBODIMENTS

Figure 1:
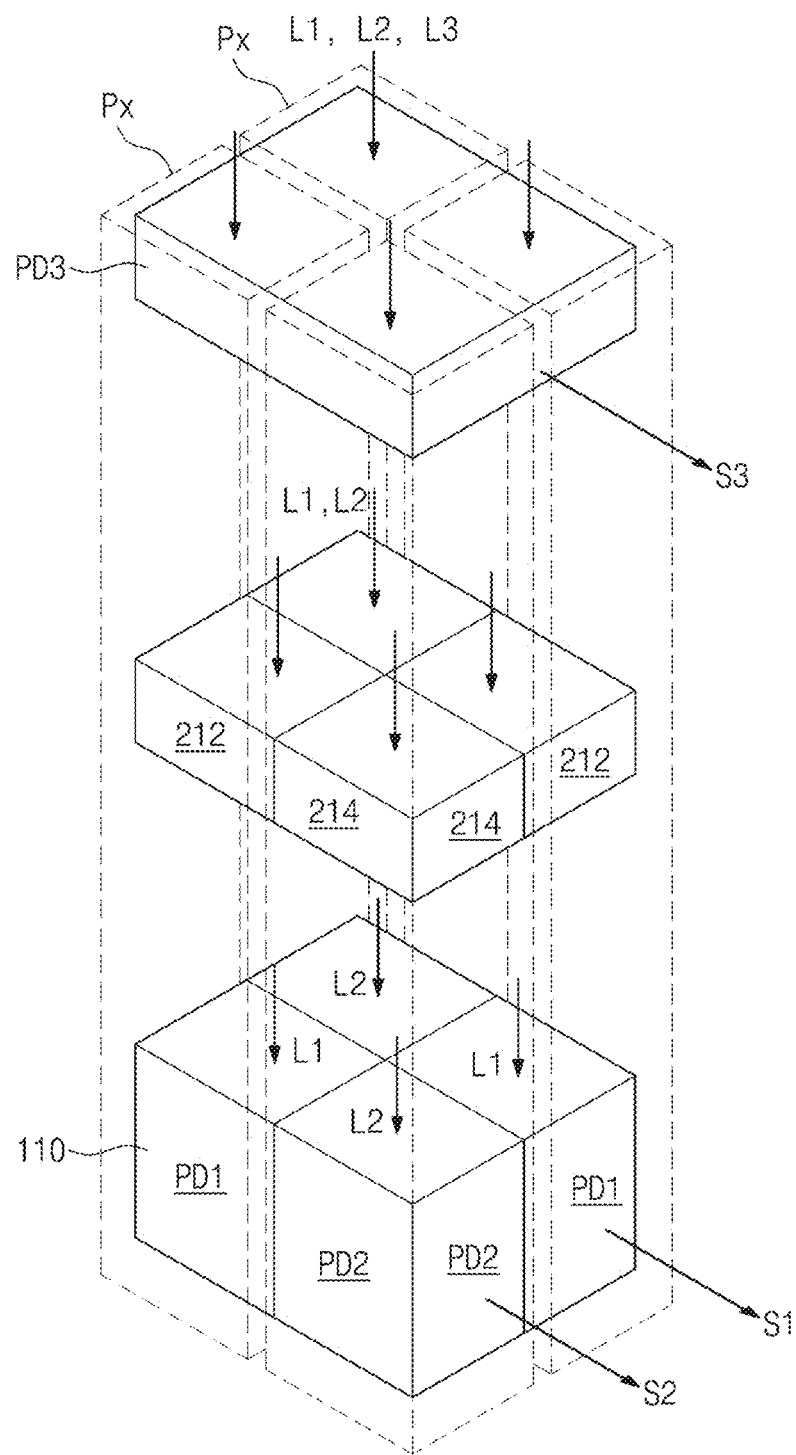
FIG. 1 is a schematic block view illustrating an image sensor according to some embodiments of inventive concepts.

Hereinafter, embodiments of inventive concepts will be described in detail with reference to the accompanying drawings. The same reference numerals or the same reference designators may denote the same elements throughout the specification.

FIG. 1 is a schematic block view illustrating an image sensor according to some embodiments of inventive concepts.

Referring to FIG. 1, an image sensor may include photoelectric conversion regions PD1 and PD2, color filters 212 and 214, and a photoelectric conversion layer PD3. The photoelectric conversion regions PD1 and PD2 may be provided in a substrate 110. The photoelectric conversion layer PD3 may be provided on a surface of the substrate 110, and the color filters 212 and 214 may be provided between the photoelectric conversion layer PD3 and the substrate 110.

Lights L1, L2, and L3 having first, second, and third wavelengths may be incident on the photoelectric conversion layer PD3. The first wavelength and the second wavelength may be different from the third wavelength. The first wavelength may be different from the second wavelength. For example, the light L1 of the first wavelength may have a red color, the light L2 of the second wavelength may have a blue color, and the light L3 of the third wavelength may have a green color.

The photoelectric conversion layer PD3 may generate a third photoelectric signal S3 from the light L3 of the third wavelength. The photoelectric conversion layer PD3 may transmit the light L1 of the first wavelength and the light L2 of the second wavelength. The photoelectric conversion layer PD3 may be shared by a plurality of pixels Px.

The lights L1 and L2 transmitted through the photoelectric conversion layer PD3 may be incident on the color filters 212 and 214. The color filters 212 and 214 may include first color filters 212 and second color filters 214. Each of, or at least one of, the pixels Px may include one of the first color filter 212 and the second color filter 214. The light L1 of the first wavelength may transmit through the first color filter 212 but may not transmit through the second color filter 214. The light L2 of the second wavelength may transmit through the second color filter 214 but may not transmit through the first color filter 212.

The photoelectric conversion regions PD1 and PD2 may include first photoelectric conversion regions PD1 and second photoelectric conversion regions PD2. Each of, or at least one of, the pixels Px may include one of the first photoelectric conversion region PD1 and the second photoelectric conversion region PD2. The pixel Px including the first color filter 212 may include the first photoelectric conversion region PD1, and the pixel Px including the second color filter 214 may include the second photoelectric conversion region PD2. For example, the first photoelectric conversion region PD1 may be provided under the first color filter 212, and the second photoelectric conversion region PD2 may be provided under the second color filter 214.

The light L1 of the first wavelength may be incident on the first photoelectric conversion region PD1 through the first color filter 212. The first photoelectric conversion region PD1 may generate a first photoelectric signal S1 from the light L1 of the first wavelength. The light L2 of the second wavelength may be incident on the second photoelectric conversion region PD2 through the second color filter 214. The second photoelectric conversion region PD2 may generate a second photoelectric signal S2 from the light L2 of the second wavelength.

According to some embodiments of inventive concepts, the photoelectric conversion layer PD3 may be on the photoelectric conversion regions PD1 and PD2, and thus an integration density of the image sensor may be improved.

Hereinafter, operation of the photoelectric conversion layer PD3 will be described with reference to FIGS. 2A and 2B, and operation of the photoelectric conversion regions PD1 and PD2 will be described with reference to FIG. 2C.

Figure 2A:
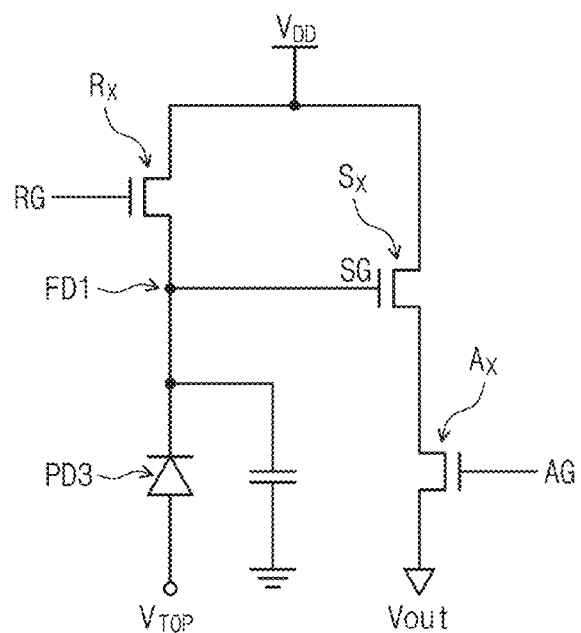
FIGS. 2A to 2C are circuit diagrams for explaining operation of a photoelectric conversion layer of an image sensor according to some embodiments of inventive concepts.
Figure 2B:
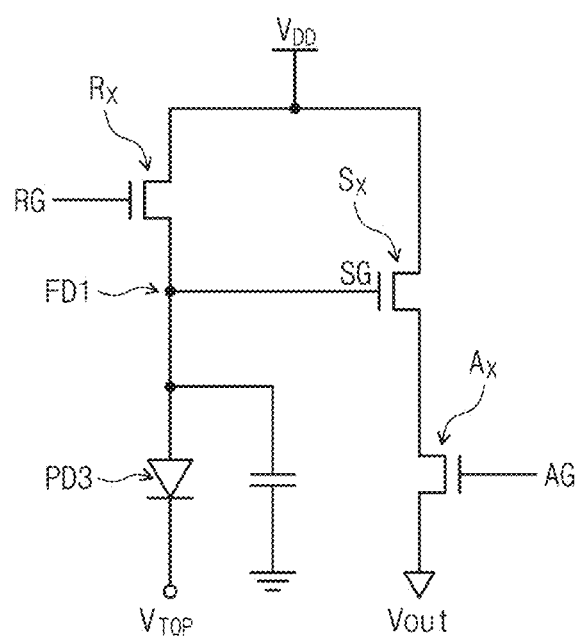

FIGS. 2A and 2B are circuit diagrams for explaining operation of a photoelectric conversion layer of an image sensor according to some embodiments of inventive concepts.

Referring to FIGS. 2A and 2B, each of, or at least one of, the pixels may include a first source follower transistor $S_X$, a first reset transistor $R_X$, and a first selection transistor $A_X$. The first source follower transistor $S_X$, the first reset transistor $R_X$, and the first selection transistor $A_X$ may include a first source follower gate SG, a first reset gate RG, and a first selection gate AG, respectively.

A first floating diffusion region FD1 may function as a source of the first reset transistor $R_X$. The first floating diffusion region FD1 may be electrically connected to the first source follower gate SG of the first source follower transistor $S_X$. The first source follower transistor $S_X$ may be connected to the first selection transistor $A_X$.

The photoelectric conversion layer PD3 of each pixel may operate as follows.

In a state in which light is blocked, a power voltage $V_{DD}$ may be applied to a drain of the first reset transistor $R_X$ and a drain of the first source follower transistor $S_X$ and the first reset transistor $R_X$ may be turned on. Thus, charges remaining in the first floating diffusion region FD1 may be discharged. The first reset transistor $R_X$ may be turned off after discharging the charges in the first floating diffusion region FD1.

When light is incident from the outside on the photoelectric conversion layer PD3, photocharges (e.g., electron-hole pairs) may be generated in the photoelectric conversion layer PD3. When a voltage $V_{TOP}$ is applied to the photoelectric conversion layer PD3, the generated photocharges may be transferred to and accumulated in the first floating diffusion region FD1. FIG. 2A illustrates a circuit diagram of a case in which the photocharges transferred from the photoelectric conversion layer PD3 to the first floating diffusion region FD1 are electrons, and FIG. 2B illustrates a circuit diagram of a case in which the photocharges transferred from the photoelectric conversion layer PD3 to the first floating diffusion region FD1 are holes. A gate bias of the first source follower transistor $S_X$ may be varied in proportion to the amount of the charges accumulated in the first floating diffusion region FD1. This may cause a variation in source potential of the first source follower transistor $S_X$. At this time, when the first selection transistor $A_X$ is turned on, a signal generated by the light incident on the photoelectric conversion layer PD3 may be outputted to an output line Vout.

One pixel including three transistors $R_X$, $S_X$, and $A_X$ is illustrated as an example in FIGS. 2A and 2B. However, embodiments of inventive concepts are not limited thereto. In some embodiments, the first reset transistor $R_X$, the first source follower transistor $S_X$, and/or the first selection transistor $A_X$ may be shared by pixels adjacent to one another. Thus, the integration density of the image sensor may be improved.

Figure 2C:
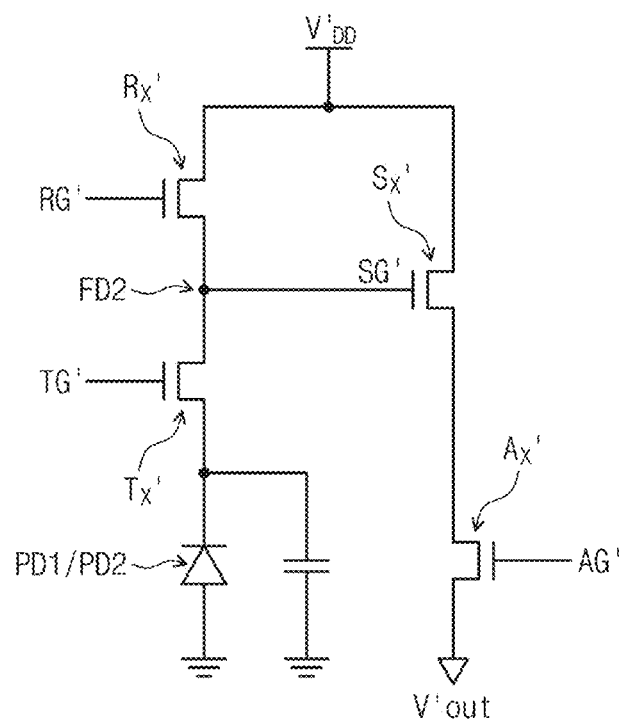

FIG. 2C is a circuit diagram for explaining operation of a photoelectric conversion region of an image sensor according to some embodiments of inventive concepts.

Referring to FIG. 2C, each of, or at least one of, the pixels may further include a transfer transistor $T_X'$, a second source follower transistor $S_X'$, a second reset transistor $R_X'$, and a second selection transistor $A_X'$. The transfer transistor $T_X'$, the second source follower transistor $S_X'$, the second reset transistor $R_X'$, and the second selection transistor $A_X'$ may include a transfer gate TG', a second source follower gate SG', a second reset gate RG', and a second selection gate AG', respectively.

A second floating diffusion region FD2 may function as a drain of the transfer transistor $T_X'$. The second floating diffusion region FD2 may also function as a source of the second reset transistor $R_X'$. The second floating diffusion region FD2 may be electrically connected to the second source follower gate SG' of the second source follower transistor $S_X'$. The second source follower transistor $S_X'$ may be connected to the second selection transistor $A_X'$.

When light is incident from the outside on the photoelectric conversion region PD1/PD2, electron-hole pairs may be generated in the photoelectric conversion region PD1/PD2. The generated holes may be moved into and accumulated in a P-type dopant region of the photoelectric conversion region PD1/PD2, and the generated electrons may be moved into and accumulated in an N-type dopant region of the photoelectric conversion region PD1/PD2. When the transfer transistor $T_X'$ is turned on, the generated charges (e.g., holes or electrons) may be transferred into and accumulated in the second floating diffusion region FD2.

Operations and functions of the second source follower transistor $S_X'$, the second reset transistor $R_X'$, and the second selection transistor $A_X'$ may be substantially the same as those of the first source follower transistor $S_X$, the first reset transistor $R_X$, and the first selection transistor $A_X$, described with reference to FIGS. 2A and 2B.

In some embodiments, the second source follower transistor $S_X'$, the second reset transistor $R_X'$, and the second selection transistor $A_X'$ may be provided separately from and operated independently from the first source follower transistor $S_X$, the first reset transistor $R_X$, and the first selection transistor $A_X$.

In some embodiments, the photoelectric conversion region PD1/PD2 and the photoelectric conversion layer may share the first source follower transistor $S_X$, the first reset transistor $R_X$, and/or the first selection transistor $A_X$, described with reference to FIGS. 2A and 2B. Accordingly, the second source follower transistor $S_X'$, the second reset transistor $R_X'$, and/or the second selection transistor $A_X'$ may not be provided.

Figure 3:
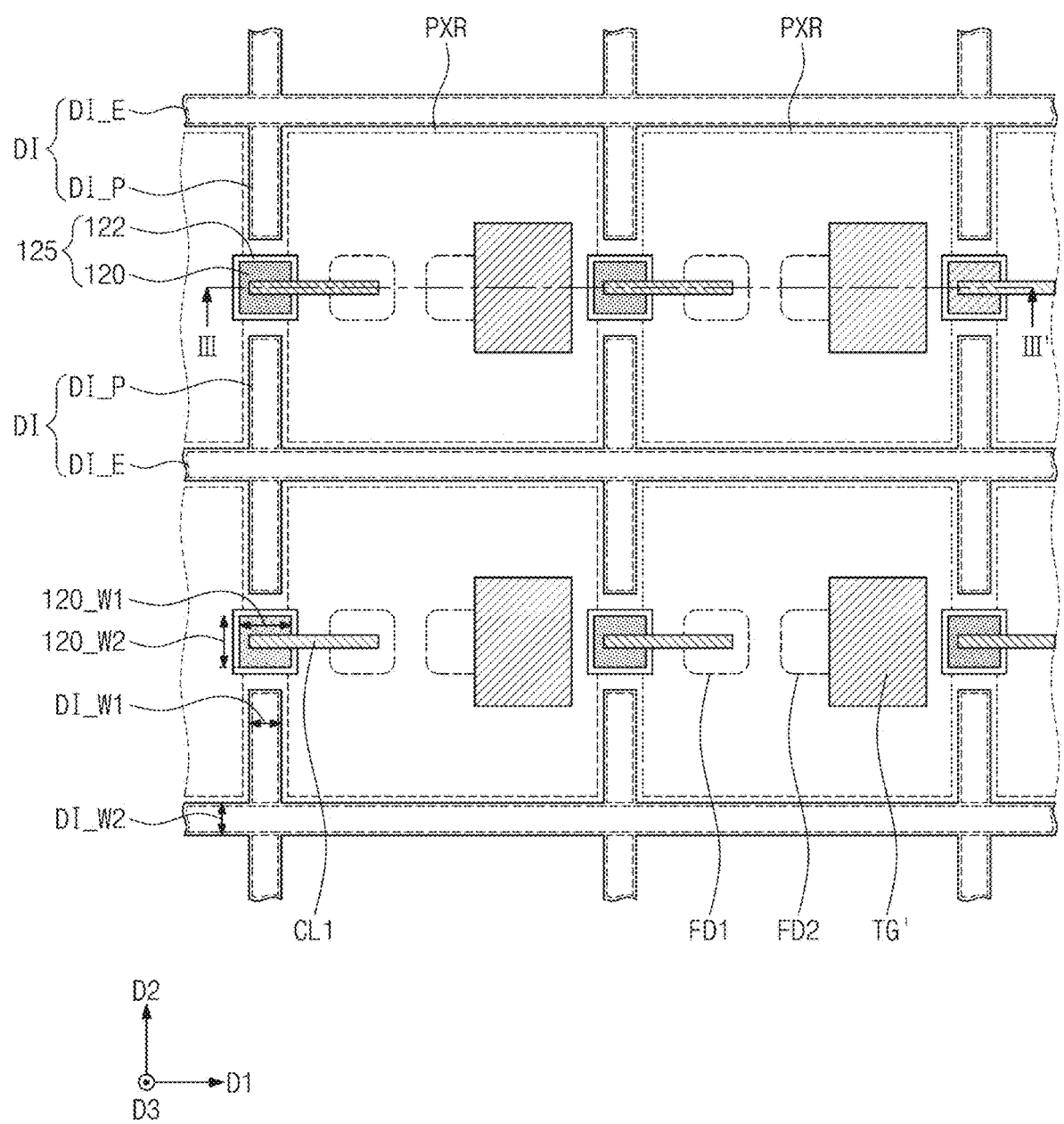
FIG. 3 is a plan view illustrating an image sensor according to some embodiments of inventive concepts.
Figure 4A:
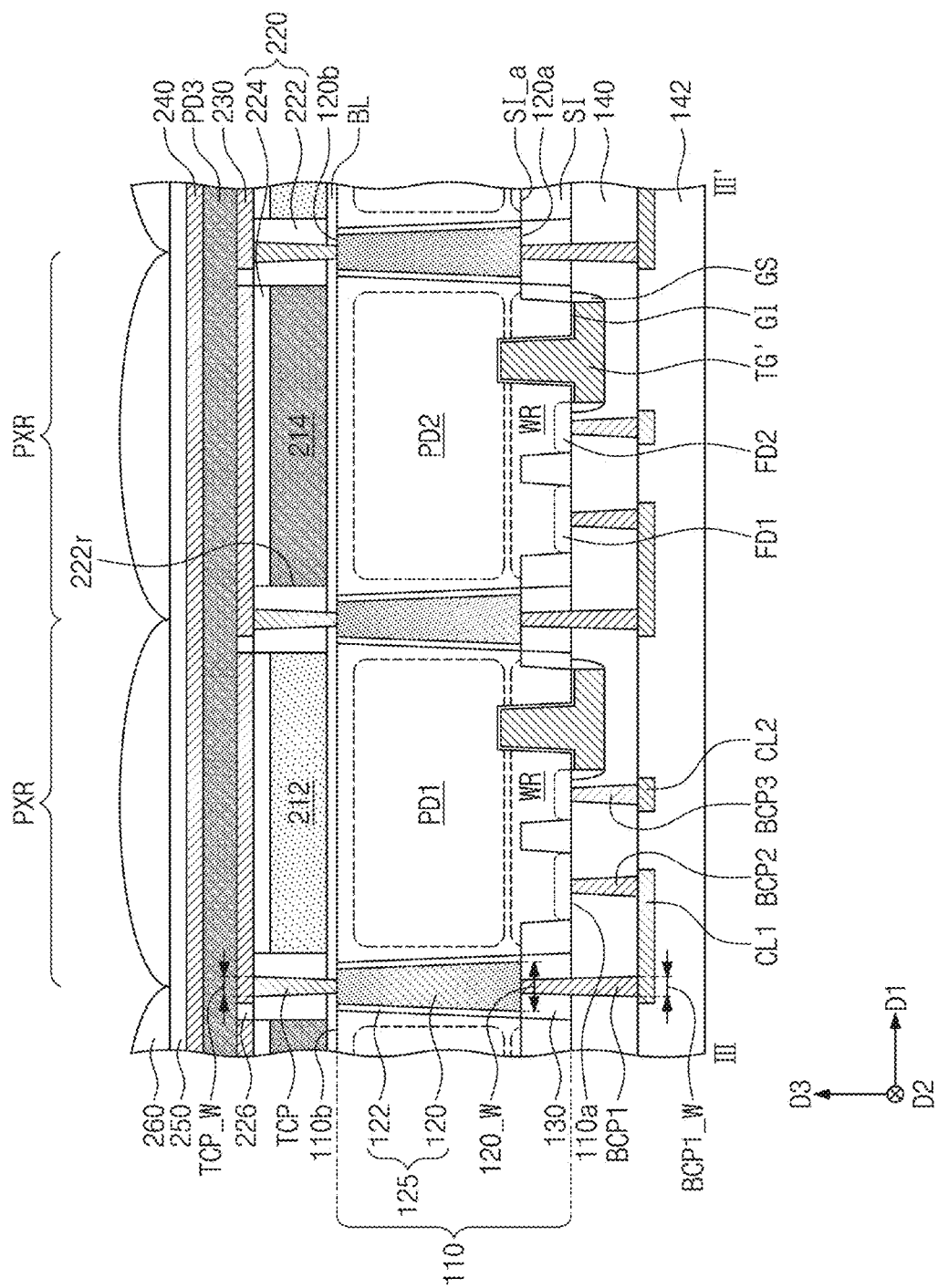
FIGS. 4A to 4C are cross-sectional views illustrating image sensors according to some embodiments of inventive concepts.
Figure 4B:
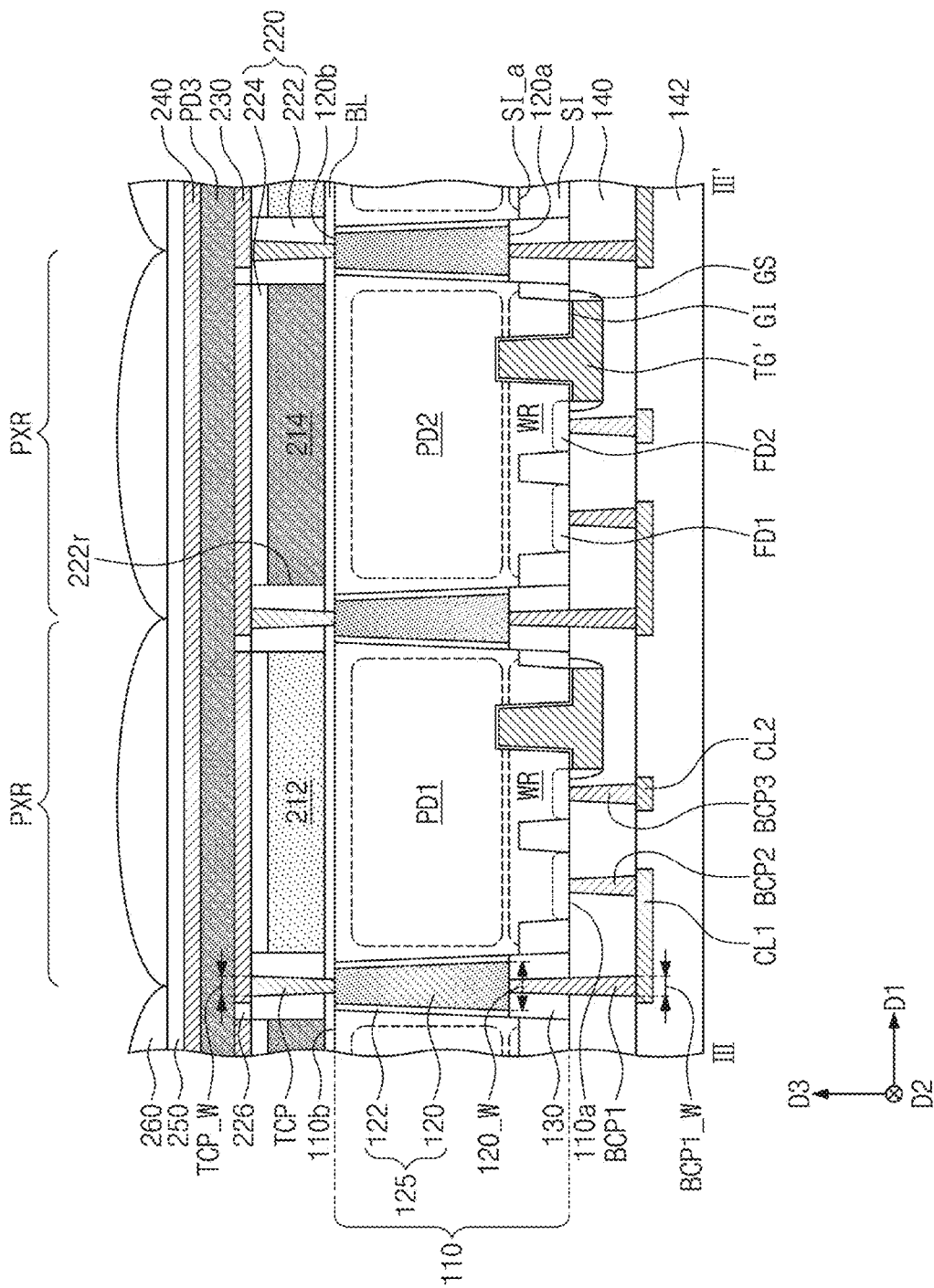
Figure 4C:
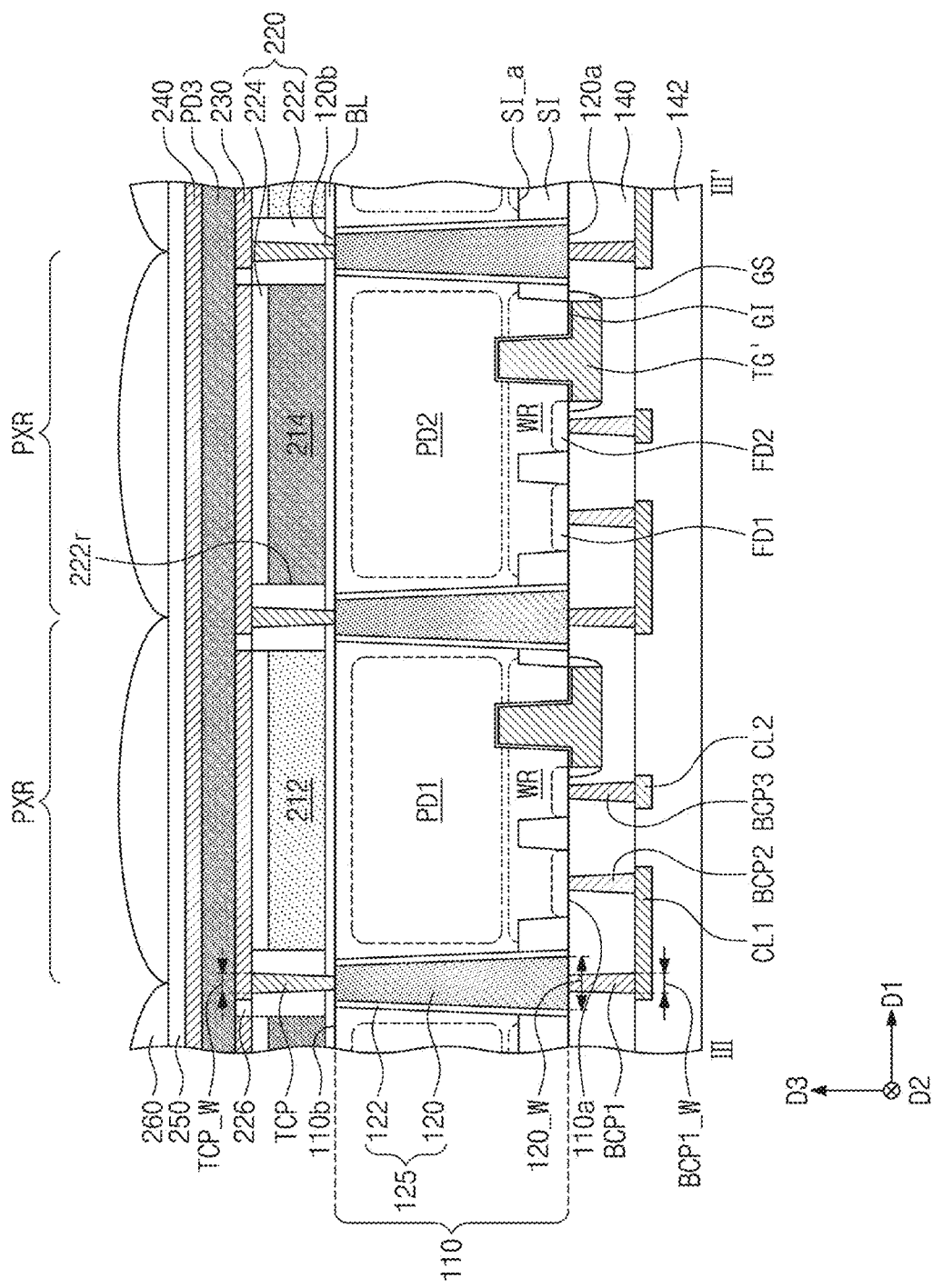

FIG. 3 is a plan view illustrating an image sensor according to some embodiments of inventive concepts. FIGS. 4A to 4C are cross-sectional views illustrating image sensors according to some embodiments of inventive concepts. FIGS. 4A to 4C are cross-sectional views corresponding to a line III-III' of FIG. 3.

Referring to FIGS. 3 and 4A to 4C, a substrate 110 may be provided. The substrate 110 may have a first surface 110a and a second surface 110b opposite to the first surface. The first surface 110a of the substrate 110 may be or may include a front surface, and the second surface 110b of the substrate 110 may be or may include a back surface. For example, the substrate 110 may include a bulk silicon substrate, a silicon-on-insulator (SOI) substrate, and/or a semiconductor epitaxial layer. The substrate 110 may have a first conductivity type (e.g., a P-type).

The substrate 110 may include a plurality of pixel regions PXR arranged two-dimensionally. The pixel regions PXR may include a plurality of rows parallel to a first direction D1. For example, the pixel regions PXR may be arranged in the first direction D1 in each of the rows. The plurality of rows consisting of the pixel regions PXR may be arranged in a second direction D2 intersecting the first direction D1.

First device isolation patterns DI may be provided in the substrate 110. Each of, or at least one of, the first device isolation patterns DI may be or may include a deep device isolation pattern that extends from the first surface 110a to the second surface 110b of the substrate 110.

Each of, or at least one of, the first device isolation patterns DI may include an extension DI_E extending in the first direction D1. The extensions DI_E may be between the rows of the pixel regions PXR. One row consisting of the pixel regions PXR may be between the extensions DI_E of a pair of the first device isolation patterns DI adjacent to one another. For example, the extensions DI_E and the rows of the pixel regions PXR may be alternately arranged in the second direction D2.

Each of, or at least one of, the first device isolation patterns DI may further include protrusions DI_P that extend from the extension DI_E in parallel to the second direction D2. The protrusions DI_P may extend between the pixel regions PXR included in each of adjacent rows.

In some embodiments, the first device isolation patterns DI may include an insulating material having a lower refractive index than the substrate 110 (e.g., silicon). For example, the first device isolation patterns DI may include at least one of silicon oxide, silicon nitride, undoped poly-silicon, or air.

In some embodiments, the first device isolation patterns DI may include a conductive layer (not shown) and an insulating layer (not shown) between the conductive layer and the substrate 110. For example, the conductive layer may include poly-silicon doped with dopants and/or a metal. For example, the insulating layer may include silicon oxide, silicon nitride, and/or silicon oxynitride.

A second device isolation pattern SI may be provided in the substrate 110. The second device isolation pattern SI may be or may include a shallow device isolation pattern that is formed from the first surface 110a in the substrate 110. A depth of the second device isolation pattern SI may be smaller than a depth of the first device isolation pattern DI.

The second device isolation pattern SI may define an active region in each of the pixel regions PXR. The active region may be or may include a region for transistors on the first surface 110a of the substrate 110. For example, the transistors on the first surface 110a may include the transistors $R_X$, $S_X$, $A_X$, $T_X'$, $R_X'$, $S_X'$, and/or $A_X'$ described with reference to FIGS. 2A to 2C. For example, the second device isolation pattern SI may include silicon oxide, silicon nitride, and/or silicon oxynitride.

Through-electrodes 120 may be provided in the substrate 110. The through-electrodes 120 may include a conductive material. In some embodiments, the through-electrodes 120 may include poly-silicon doped with N-type dopants or P-type dopants. In some embodiments, a concentration of the N-type or P-type dopants included in the through-electrodes 120 may be greater than $10^{19}/cm^3$. In some embodiments, the N-type dopants may be or may include arsenic or phosphorus. In some embodiments, the P-type dopants may be or may include boron. However, inventive concepts are not limited thereto.

The through-electrodes 120 may be between the pixel regions PXR when viewed in a plan view. For example, the through-electrodes 120 may be between the pixel regions PXR in each of the rows consisting of the pixel regions PXR. For example, each of, or at least one of, the through-electrodes 120 may be between the protrusions DI_P that face one another and are respectively included in a pair of the first device isolation patterns DI adjacent to one another. The through-electrodes 120 and the pixel regions PXR may be alternately arranged in the first direction D1 in each of the plurality of rows.

As illustrated in FIG. 3, a width 120_W1 of each of, or at least one of, the through-electrodes 120 in the first direction D1 may be greater than a width DI_W1 of each of the protrusions DI_P of the first device isolation patterns DI in the first direction D1 when viewed in a plan view. In addition, a width 120_W2 of each of, or at least one of, the through-electrodes 120 in the second direction D2 may be greater than a width DI_W2 of the extension DI_E of each of the first device isolation patterns DI in the second direction D2 when viewed in a plan view.

As illustrated in FIG. 4A, a width 120_W of each of, or at least one of, the through-electrodes 120 may decrease as a vertical distance from the second surface 110b of the substrate 110 decreases, when viewed in a cross-sectional view.

Each of, or at least one of, the through-electrodes 120 may extend in a third direction D3 substantially perpendicular to the first surface 110a of the substrate 110. One end 120b of each of, or at least one of, the through-electrodes 120 may be substantially coplanar with the second surface 110b of the substrate 110.

According to some embodiments, as illustrated in FIGS. 4A and 4B, another end 120a of each of, or at least one of, the through-electrodes 120 may be recessed from the first surface 110a toward the second surface 110b of the substrate 110. For example, the another end 120a of each of, or at least one of, the through-electrodes 120 may be at a level (or a height) between the first surface 110a and the second surface 110b of the substrate 110. For example, a vertical distance between the one end 120b and the another end 120a of each of, or at least one of, the through-electrodes 120 may be smaller than a vertical distance between the second surface 110b and the first surface 110a of the substrate 110. In some embodiments, the another end 120a of each of, or at least one of, the through-electrodes 120 may be at substantially the same level as a bottom surface SI_a of the second device isolation pattern SI, as illustrated in FIG. 4A. In some embodiments, the another end 120a of each of, or at least one of, the through-electrodes 120 may be at a level between the bottom surface SI_a of the second device isolation pattern SI and the second surface 110b of the substrate 110, as illustrated in FIG. 4B. In some embodiments, the another end 120a of each of, or at least one of, the through-electrodes 120 may be at a level between the bottom surface SI_a of the second device isolation pattern SI and the first surface 110a of the substrate 110, unlike FIGS. 4A and 4B.

In these embodiments, a filling insulation pattern 130 may be provided on the another end 120a of each of, or at least one of, the through-electrodes 120. One surface of the filling insulation pattern 130 may be substantially coplanar with the first surface 110a of the substrate 110. For example, the filling insulation pattern 130 may include at least one of silicon oxide, silicon nitride, or silicon oxynitride.

In some embodiments, the another end 120a of each of, or at least one of, the through-electrodes 120 may be substantially coplanar with the first surface 110a of the substrate 110, as illustrated in FIG. 4C. In these embodiments, the filling insulation pattern 130 of FIGS. 4A and 4B may not be provided.

A through insulating pattern 122 may be provided between the substrate 110 and a sidewall of each of, or at least one of, the through-electrodes 120. For example, the through insulating pattern 122 may include at least one of silicon oxide, silicon nitride, or silicon oxynitride.

Each of, or at least one of, the through-electrodes 120 and the through insulating pattern 122 on the sidewall thereof may include a through-structure 125. In some embodiments, the through-structures 125 may be spaced apart from the first device isolation patterns DI, as illustrated in FIG. 3.

Figure 5:
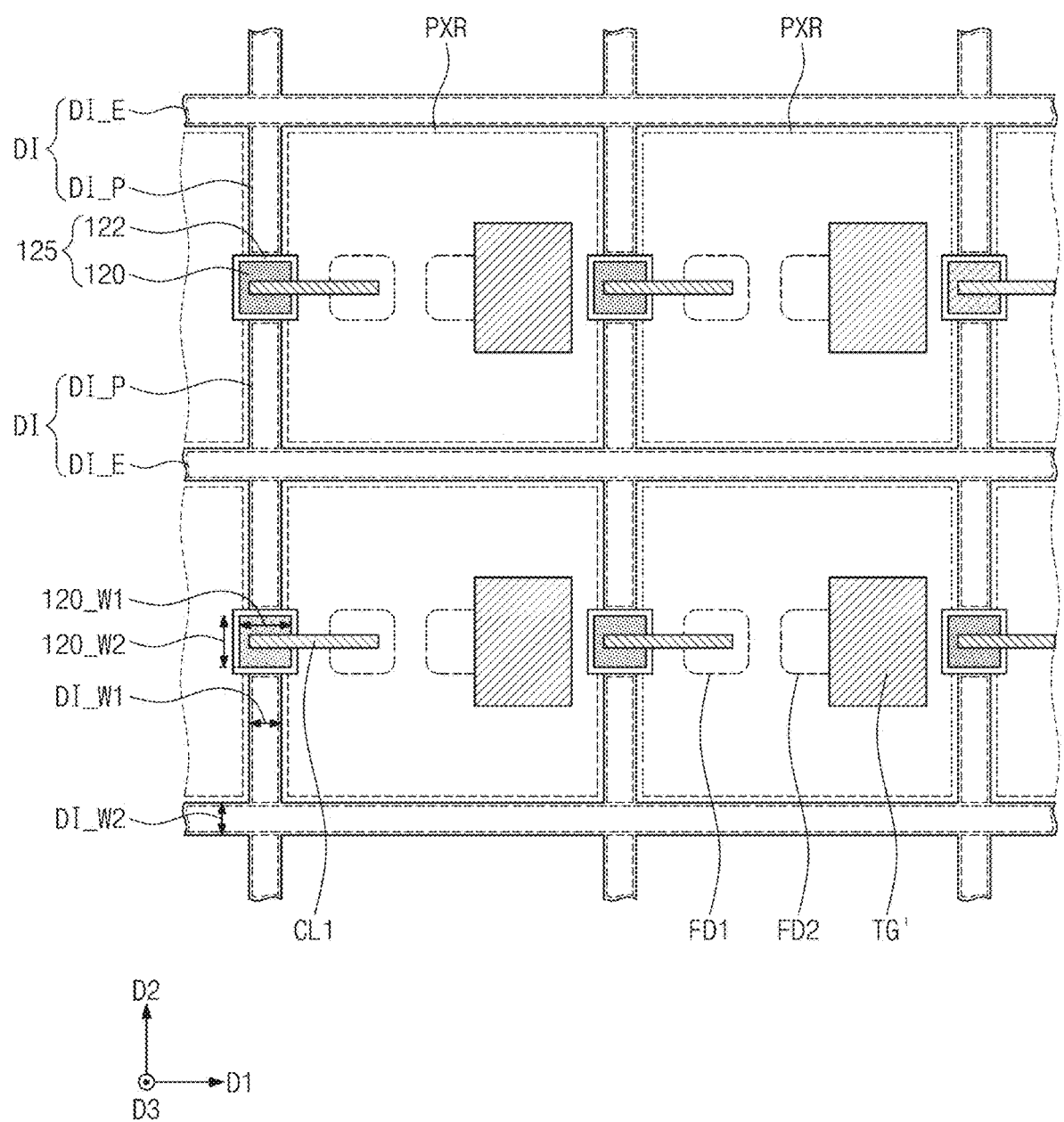
FIG. 5 is a plan view illustrating an image sensor according to some embodiments of inventive concepts.

FIG. 5 is a plan view illustrating an image sensor according to some embodiments of inventive concepts. In some embodiments, each of, or at least one of, the through-structures 125 may be in contact with the protrusions DI_P which face one another and are respectively included in a pair of the adjacent first device isolation patterns DI, as illustrated in FIG. 5.

Referring again to FIGS. 3 and 4A to 4C, photoelectric conversion regions PD1 and PD2 may be provided in the substrate 110. In more detail, the photoelectric conversion region PD1 or PD2 may be in each of, or at least one of, the pixel regions PXR of the substrate 110. The photoelectric conversion regions PD1 and PD2 may include first photoelectric conversion regions PD1 and second photoelectric conversion regions PD2. The first photoelectric conversion regions PD1 may correspond to the first photoelectric conversion regions PD1 described with reference to FIG. 1, and the second photoelectric conversion regions PD2 may correspond to the second photoelectric conversion regions PD2 described with reference to FIG. 1. The first and second photoelectric conversion regions PD1 and PD2 may be arranged two-dimensionally and may be alternately arranged in the first direction D1 and the second direction D2 when viewed in a plan view.

The photoelectric conversion regions PD1 and PD2 may be doped with dopants of a second conductivity type (e.g., an N-type) different from the first conductivity type (e.g., the P-type). Thus, the photoelectric conversion regions PD1 and PD2 may have the second conductivity type. For example, each of, or at least one of, the photoelectric conversion regions PD1 and PD2 may have a potential gradient between the first surface 110a and the second surface 110b of the substrate 110. A dopant concentration of a portion, adjacent to the first surface 110a, of each of, or at least one of, the photoelectric conversion regions PD1 and PD2 may be different from a dopant concentration of another portion, adjacent to the second surface 110b, of each of, or at least one of, the photoelectric conversion regions PD1 and PD2. For example, each of, or at least one of, the photoelectric conversion regions PD1 and PD2 may include a plurality of stacked dopant regions.

Well dopant regions WR may be provided in the substrate 110. In detail, the well dopant regions WR may be in the pixel regions PXR of the substrate 110, respectively. Each of, or at least one of, the well dopant regions WR may be adjacent to the first surface 110a of the substrate 110. Thus, the well dopant region WR may be between the photoelectric conversion region PD1 or PD2 and the first surface 110a of the substrate 110 in each of, or at least one of, the pixel regions PXR. For example, the photoelectric conversion region PD1 or PD2 may be between the well dopant region WR and the second surface 110b of the substrate 110.

The well dopant regions WR may be doped with dopants of the first conductivity type (e.g., the P-type). Thus, the well dopant regions WR may have the first conductivity type.

First floating diffusion regions FD1 and second floating diffusion regions FD2 may be provided in the substrate 110. In detail, each of, or at least one of, the first floating diffusion regions FD1 and each of, or at least one of, the second floating diffusion regions FD2 may be provided in each of, or at least one of, the pixel regions PXR of the substrate 110. Each of, or at least one of, the first floating diffusion regions FD1 may correspond to the first floating diffusion region FD1 described with reference to FIGS. 2A and 2B, and each of, or at least one of, the second floating diffusion regions FD2 may correspond to the second floating diffusion region FD2 described with reference to FIG. 2C.

In each of, or at least one of, the pixel regions PXR, the first floating diffusion region FD1 and the second floating diffusion region FD2 may be in the well dopant region WR and may be adjacent to the first surface 110a of the substrate 110. As illustrated in FIGS. 3 and 5, the first floating diffusion region FD1 and the second floating diffusion region FD2 may be arranged in a line in the first direction D1. However, embodiments of inventive concepts are not limited thereto. In some embodiments, planar arrangement of the first floating diffusion region FD1 and the second floating diffusion region FD2 may be variously changed. In each of, or at least one of, the pixel regions PXR, the first floating diffusion region FD1 may be spaced apart from the second floating diffusion region FD2, and the second device isolation pattern SI may extend between the first and second floating diffusion regions FD1 and FD2. In each of, or at least one of, the pixel regions PXR, the first floating diffusion region FD1 and the second floating diffusion region FD2 may be electrically isolated from one another by a potential barrier.

The first floating diffusion regions FD1 and the second floating diffusion regions FD2 may be doped with dopants of the second conductivity type (e.g., the N-type). Thus, the first and second floating diffusion regions FD1 and FD2 may have the second conductivity type.

Transfer gates TG' may be on the first surface 110a of the substrate 110. The transfer gates TG' may be to correspond to the pixel regions PXR, respectively. A corresponding one of the second floating diffusion regions FD2 may be at a side of each of, or at least one of, the transfer gates TG'.

Each of, or at least one of, the transfer gates TG' may include a lower portion inserted in the substrate 110 and an upper portion protruding from the first surface 110a of the substrate 110. The upper portion is connected to the lower portion. Each of, or at least one of, the transfer gates TG' may correspond to the transfer gate TG' described with reference to FIG. 2C.

A gate insulating pattern GI may be provided between each of, or at least one of, the transfer gates TG' and the substrate 110. A gate spacer GS may be provided on a sidewall of the upper portion of each of, or at least one of, the transfer gates TG'. For example, each of, or at least one of, the gate insulating pattern GI and the gate spacer GS may include at least one of silicon oxide, silicon nitride, or silicon oxynitride.

A first source follower gate (not shown), a first reset gate (not shown), a first selection gate (not shown), a second source follower gate (not shown), a second reset gate (not shown), and/or a second selection gate (not shown) may be provided on the first surface 110a of the substrate 110. The gates may be configured to perform substantially the same functions and/or operations as described with reference to FIGS. 2A to 2C.

A first interlayer insulating layer 140 may be provided on the first surface 110a of the substrate 110. The first interlayer insulating layer 140 may cover the gates (e.g., the transfer gates TG') provided on the first surface 110a of the substrate 110. For example, the first interlayer insulating layer 140 may include at least one of silicon oxide, silicon nitride, or silicon oxynitride.

First bottom contact plugs BCP1 may penetrate the first interlayer insulating layer 140 so as to be connected to the through-electrodes 120, respectively. A width BCP1_W of each of, or at least one of, the first bottom contact plugs BCP1 may be smaller than the width 120_W of each of, or at least one of, the through-electrodes 120 when viewed in a cross-sectional view. The width BCP1_W of each of, or at least one of, the first bottom contact plugs BCP1 may taper. For example, the width BCP1_W of each of, or at least one of, the first bottom contact plugs BCP1 progressively decrease as being adjacent to the through-electrode 120 connected thereto when viewed in a cross-sectional view.

Second bottom contact plugs BCP2 may penetrate the first interlayer insulating layer 140 so as to be connected to the first floating diffusion regions FD1, respectively, and third bottom contact plugs BCP3 may penetrate the first interlayer insulating layer 140 so as to be connected to the second floating diffusion regions FD2, respectively. A width of each of, or at least one of, the second bottom contact plugs BCP2 and a width of each of, or at least one of, the third bottom contact plugs BCP3 may taper. For example, the width of each of, or at least one of, the second bottom contact plugs BCP2 and the width of the each of, or at least one of, the third bottom contact plugs BCP3 may progressively decrease as being adjacent to the first surface 110a of the substrate 110. Lengths of the second bottom contact plugs BCP2 in the third direction D3 may be substantially equal to lengths of the third bottom contact plugs BCP3 in the third direction D3.

The first to third bottom contact plugs BCP1, BCP2, and BCP3 may include a conductive material. For example, the first to third bottom contact plugs BCP1, BCP2, and BCP3 may include a metal (e.g., tungsten).

In the case in which the filling insulation patterns 130 are provided like FIGS. 4A and 4B, the first bottom contact plugs BCP1 may further penetrate the filling insulation patterns 130, respectively. Accordingly, lengths of the first bottom contact plugs BCP1 in the third direction D3 may be greater than the lengths of the second bottom contact plugs BCP2 in the third direction D3 and the lengths of the third bottom contact plugs BCP3 in the third direction D3.

In the case in which the filling insulation patterns 130 are not provided like FIG. 4C, the lengths of the first bottom contact plugs BCP1 in the third direction D3 may be substantially equal to the lengths of the second bottom contact plugs BCP2 in the third direction D3 and the lengths of the third bottom contact plugs BCP3 in the third direction D3.

Interconnection lines CL1 and CL2 may be provided on the first interlayer insulating layer 140. The interconnection lines CL1 and CL2 may include first interconnection lines CL1 and second interconnection lines CL2. Each of, or at least one of, the first interconnection lines CL1 may connect a corresponding one of the first bottom contact plugs BCP1 to a corresponding one of the second bottom contact plugs BCP2, and each of, or at least one of, the second interconnection lines CL2 may be connected to a corresponding one of the third bottom contact plugs BCP3. Each of, or at least one of, the through-electrodes 120 may be electrically connected to the first floating diffusion region FD1 through the first bottom contact plug BCP1, the first interconnection line CL1, and the second bottom contact plug BCP2. The interconnection lines CL1 and CL2 may include a conductive material. For example, the interconnection lines CL1 and CL2 may include a metal (e.g., tungsten).

A second interlayer insulating layer 142 may be provided on the first interlayer insulating layer 140. The second interlayer insulating layer 142 may cover the interconnection lines CL1 and CL2. For example, the second interlayer insulating layer 142 may include at least one of silicon oxide, silicon nitride, or silicon oxynitride.

A buffer layer BL may be provided on the second surface 110b of the substrate 110. The buffer layer BL may inhibit charges (e.g., electrons or holes) generated by defects of the second surface 110b of the substrate 110 from moving to the photoelectric conversion regions PD1 and PD2. The buffer layer BL may include a metal oxide. For example, the buffer layer BL may include aluminum oxide and/or hafnium oxide.

An insulating structure 220 may be provided on the buffer layer BL. Color filters 212 and 214 may be buried in the insulating structure 220. For example, the insulating structure 220 may include at least one of silicon oxide, silicon nitride, or silicon oxynitride.

In more detail, the insulating structure 220 may include a first insulating pattern 222 having recess regions 222r. The recess regions 222r may correspond to the pixel regions PXR of the substrate 110, respectively, when viewed in a plan view. The buffer layer BL may be exposed by the recess regions 222r.

The color filters 212 and 214 may include first color filters 212 and second color filters 214. The first color filters 212 may correspond to the first color filters 212 described with reference to FIG. 1, and the second color filters 214 may correspond to the second color filters 214 described with reference to FIG. 1. One of the first color filter 212 and the second color filter 214 may be in each of, or at least one of, the recess regions 222r. The first color filters 212 may correspond to the first photoelectric conversion regions PD1 in a plan view, and the second color filters 214 may correspond to the second photoelectric conversion regions PD2 in a plan view.

As described with reference to FIGS. 1 and 2C, the first color filter 212 may transmit the light L1 of the first wavelength. The first photoelectric conversion region PD1 may generate charges (e.g., electron-hole pairs) from the light L1 of the first wavelength. When the transfer transistor $T_X'$ is turned on, the generated charges (e.g., holes or electrons) may be transferred into and accumulated in the second floating diffusion region FD2. The second color filter 214 may transmit the light L2 of the second wavelength. The second photoelectric conversion region PD2 may generate charges (e.g., electron-hole pairs) from the light L2 of the second wavelength. When the transfer transistor $T_X'$ is turned on, the generated charges (e.g., holes or electrons) may be transferred into and accumulated in the second floating diffusion region FD2.

The insulating structure 220 may further include second insulating patterns 224 provided on the color filters 212 and 214. In some embodiments, the second insulating patterns 224 may be respectively provided in the recess regions 222r and may be spaced apart from one another, as illustrated in FIGS. 4A to 4C. In some embodiments, the second insulating patterns 224 may extend onto the first insulating pattern 222 so as to be connected to one another.

Top contact plugs TCP may penetrate the first insulating pattern 222 of the insulating structure 220 and the buffer layer BL so as to be connected to the through-electrodes 120, respectively. A width TCP_W of each of, or at least one of, the top contact plugs TCP may be smaller than the width 120_W of each of, or at least one of, the through-electrodes 120 when viewed in a cross-sectional view. The width TCP_W of each of, or at least one of, the top contact plugs TCP may taper. For example, taper. For example, the width TCP_W of each of, or at least one of, the top contact plugs TCP may progressively decrease as being adjacent to the through-electrode 120 connected thereto (or adjacent to the second surface 110b of the substrate 110). The top contact plugs TCP may include a conductive material. For example, the top contact plugs TCP may include a metal (e.g., tungsten).

Bottom electrodes 230 may be provided on the insulating structure 220. The bottom electrodes 230 may correspond to the pixel regions PXR of the substrate 110, respectively, when viewed in a plan view. The bottom electrodes 230 may be spaced apart from one another. Each of, or at least one of, the bottom electrodes 230 may be connected to a corresponding one of the top contact plugs TCP. Thus, each of, or at least one of, the bottom electrodes 230 may be electrically connected to the first floating diffusion region FD1 through the top contact plug TCP, the through-electrode 120, the first bottom contact plug BCP1, the first interconnection line CL1, and the second bottom contact plug BCP2. The bottom electrodes 230 may include a transparent conductive material. For example, the bottom electrodes 230 may include at least one of indium-tin oxide (ITO), indium-zinc oxide (IZO), zinc oxide (ZnO), or an organic transparent conductive material.

A third insulating pattern 226 may be provided to fill a gap between the bottom electrodes 230. A top surface of the third insulating pattern 226 may be substantially coplanar with top surfaces of the bottom electrodes 230. For example, the third insulating pattern 226 may include at least one of silicon oxide, silicon nitride, or silicon oxynitride.

A photoelectric conversion layer PD3 may be provided on the bottom electrodes 230. In some embodiments, the photoelectric conversion layer PD3 may include an organic photoelectric conversion layer. In these embodiments, the photoelectric conversion layer PD3 may include a P-type organic semiconductor material and an N-type organic semiconductor material, which may form a PN junction. In some embodiments, the photoelectric conversion layer PD3 may include quantum dots or a chalcogenide.

The photoelectric conversion layer PD3 may correspond to the photoelectric conversion layer PD3 described with reference to FIGS. 1, 2A, and 2B. As described with reference to FIG. 1, the photoelectric conversion layer PD3 may absorb the light L3 of the third wavelength to generate charges (e.g., electron-hole pairs) from the light L3 of the third wavelength. An additional color filter may not exist on the photoelectric conversion layer PD3. The charges generated in the photoelectric conversion layer PD3 may be transferred into and accumulated in the first floating diffusion region FD1 through the bottom electrode 230, the top contact plug TCP, the through-electrode 120, the first bottom contact plug BCP1, the first interconnection line CL1, and the second bottom contact plug BCP2.

A top electrode 240 may be provided on the photoelectric conversion layer PD3. The top electrode 240 may include a transparent conductive material. For example, the top electrode 240 may include at least one of indium-tin oxide (ITO), indium-zinc oxide (IZO), zinc oxide (ZnO), or an organic transparent conductive material.

A capping layer 250 may be provided on the top electrode 240. The capping layer 250 may include an insulating material. For example, the capping layer 250 may include at least one of aluminum oxide, silicon oxide, silicon nitride, or silicon oxynitride.

Micro lenses 260 may be provided on the capping layer 250. The micro lenses 260 may be to correspond to the pixel regions PXR, respectively, when viewed in a plan view. Each of, or at least one of, the micro lenses 260 may have a convex shape and may have a specific radius of curvature.

According to some embodiments of inventive concepts, the substrate 110 may include the two-dimensionally arranged pixel regions PXR. The photoelectric conversion regions PD1 and PD2 may be provided in the pixel regions PXR, respectively. The photoelectric conversion layer PD3 may be provided on the substrate 110 and may selectively absorb the light of the third wavelength to generate the third photoelectric signal. The pixels of the image sensor may share the photoelectric conversion layer PD3. The color filters 212 and 214 may be between the substrate 110 and the photoelectric conversion layer PD3. The first color filters 212 selectively transmitting the light of the first wavelength may overlap with the first photoelectric conversion regions PD1, respectively, when viewed in a plan view. The second color filters 214 selectively transmitting the light of the second wavelength may overlap with the second photoelectric conversion regions PD2, respectively, when viewed in a plan view. Thus, the first photoelectric conversion regions PD1 may absorb the light of the first wavelength to generate the first photoelectric signals, and the second photoelectric conversion regions PD2 may absorb the light of the second wavelength to generate the second photoelectric signals. As a result, each of, or at least one of, the pixels of the image sensor may absorb two kinds of lights to generate two kinds of photoelectric signals.

In addition, according to some embodiments of inventive concepts, the color filters 212 and 214 may be buried in the insulating structure 220, and the top contact plugs TCP may be provided in the insulating structure 220 to connect the bottom electrodes 230 to the through-electrodes 120. Each of, or at least one of, the top contact plugs TCP may have a relatively small width. For example, the width TCP_W of each of, or at least one of, the top contact plugs TCP may be smaller than the width 120_W of each of, or at least one of, the through-electrodes 120. Thus, it is possible to secure a sufficient space, in which the color filters 212 and 214 are buried, in the insulating structure 220.

As a result, according to some embodiments of inventive concepts, the integration density of the image sensor may be improved.

FIGS. 6A to 6K are cross-sectional views illustrating a method of manufacturing an image sensor according to some embodiments of inventive concepts. FIGS. 6A to 6K are cross-sectional views corresponding to the line III-III' of FIG. 3. Hereinafter, the same elements as described with reference to FIGS. 3 and 4A to 4C will be indicated by the same reference numerals or the same reference designators, and the descriptions thereto will be omitted or mentioned briefly for the purpose of ease and convenience in explanation.

Figure 6A:
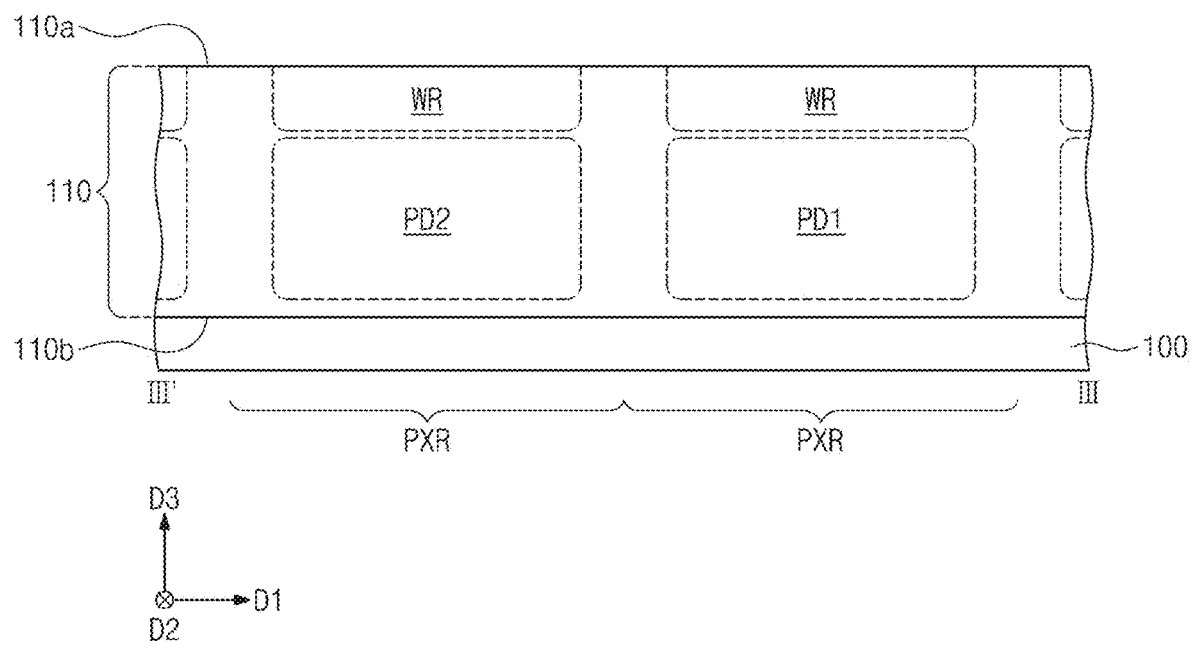
FIGS. 6A to 6K are cross-sectional views illustrating a method of manufacturing an image sensor according to some embodiments of inventive concepts.

Referring to FIGS. 3 and 6A, a substrate 110 having a first conductivity type may be provided. In some embodiments, as illustrated in FIG. 6A, providing the substrate 110 having the first conductivity type may include performing an epitaxial growth process on a sacrificial substrate 100 while supplying dopants of the first conductivity type in-situ. In some embodiments, unlike FIG. 6B, providing the substrate 110 having the first conductivity type (e.g., a P-type) may include doping a bulk silicon substrate with dopants of the first conductivity type.

The substrate 110 may include pixel regions PXR. The pixel regions PXR may be two-dimensionally arranged. For example, the pixel regions PXR may be arranged in a first direction D1 and a second direction D2 intersecting the first direction D1.

The substrate 110 may have a first surface 110a and a second surface 110b opposite to the first surface. The second surface 110b may be in contact with the sacrificial substrate 100.

Photoelectric conversion regions PD1 and PD2 and well dopant regions WR may be formed in the substrate 110. The formation of the photoelectric conversion regions PD1 and PD2 may include forming a mask (not shown) having openings corresponding to the pixel regions PXR on the first surface 110a of the substrate 110, and injecting dopants of a second conductivity type (e.g., an N-type) different from the first conductivity type into the substrate 110 by using the mask. The injecting of dopants may include ion implantation with a beam-line process. The formation of the well dopant regions WR may include injecting dopants of the first conductivity type into the substrate 110 by using the mask. The mask may be removed after the formation of the photoelectric conversion regions PD1 and PD2 and the well dopant regions WR. The photoelectric conversion regions PD1 and PD2 may be spaced apart from the first surface 110a of the substrate 110 with the well dopant regions WR interposed therebetween, and the well dopant regions WR may be adjacent to the first surface 110a of the substrate 100.

Figure 6B:
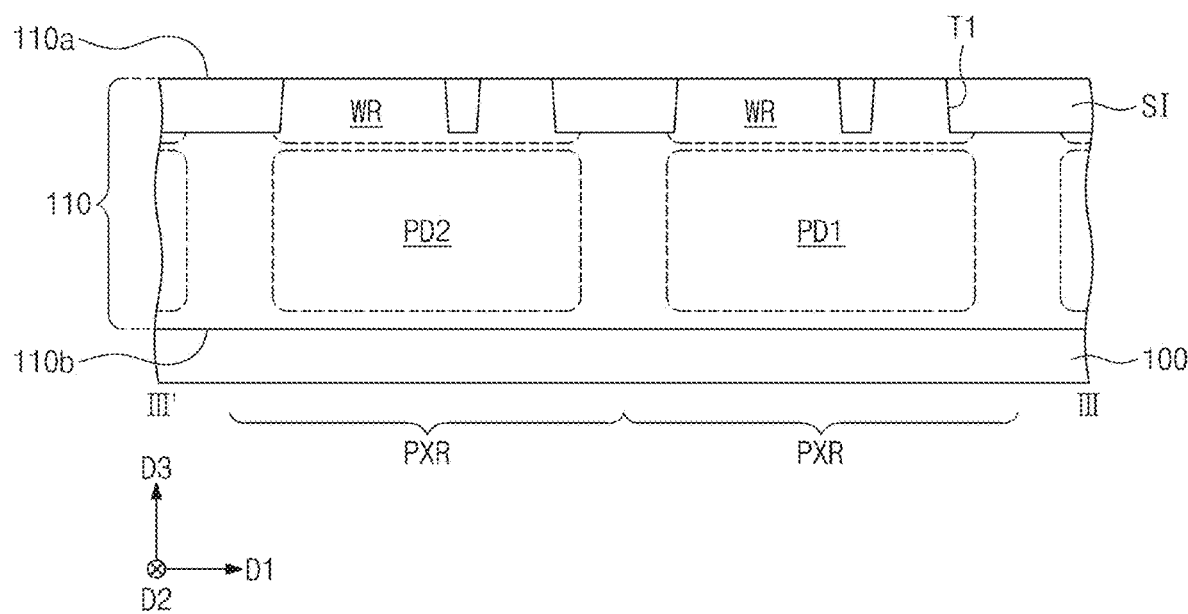

Referring to FIGS. 3 and 6B, a shallow trench ST may be formed in the substrate 110 from the first surface 110a. The shallow trench ST may define an active region in each of, or at least one of, the pixel regions PXR. A depth of the shallow trench ST may be smaller than depths of the well dopant regions WR.

A second device isolation pattern SI may be formed to fill the shallow trench ST. The formation of the second device isolation pattern SI may include forming an insulating layer (not shown) filling the shallow trench ST on the first surface 110a of the substrate 110 and performing a planarization process on the insulating layer until the first surface 110a is exposed. The insulating layer may be formed with a high-density plasma (HDP) deposition process and/or a spin-on glass (SOG) deposition process, however, inventive concepts are not limited thereto. The planarization process may include a CMP process; however, inventive concepts are not limited thereto.

Figure 6C:
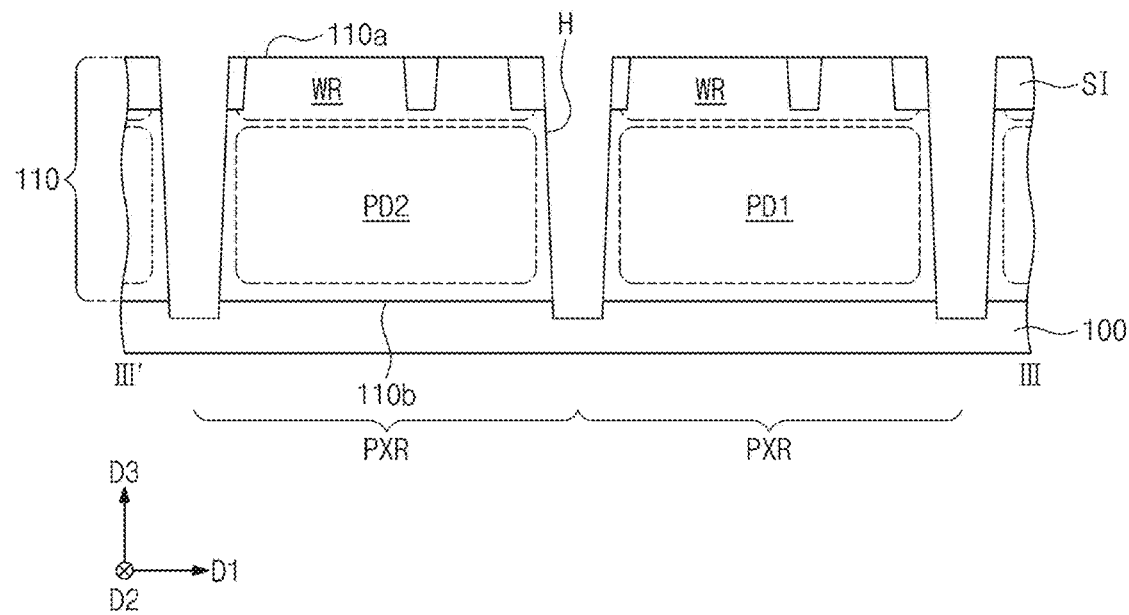

Referring to FIGS. 3 and 6C, through-holes H may be formed between the pixel regions PXR. For example, the through-holes H may be formed between the pixel regions PXR arranged in a first direction, when viewed in a plan view. The through-holes H may overlap with the second device isolation pattern SI when viewed in a plan view. Each of, or at least one of, the through-holes H may penetrate the second device isolation pattern SI and the substrate 110, and an upper portion of the sacrificial substrate 100 under the through-holes H may be recessed. The formation of the through-holes H may include forming a mask (not shown) on the first surface 110a of the substrate 110 and performing an anisotropic etching process using the mask as an etch mask. In some example embodiments, the formation of the through-holes may include a Bosch process.

Figure 6D:
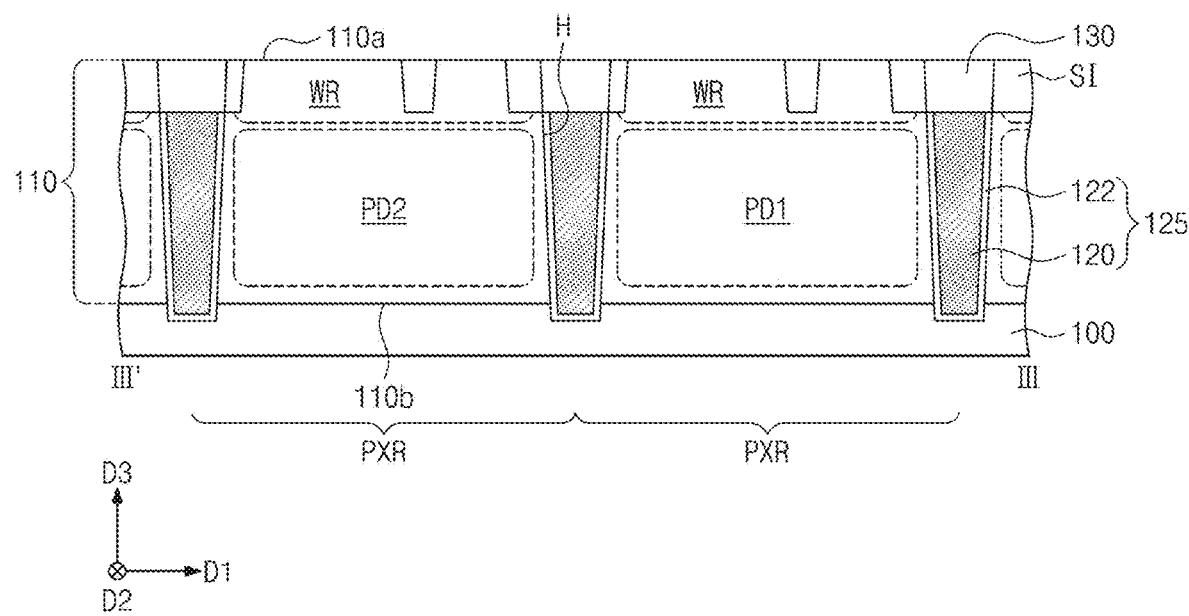

Referring to FIGS. 3 and 6D, a through insulating pattern 122 and a through-electrode 120 may be formed to fill at least a portion of each of, or at least one of, the through-holes H. The through insulating pattern 122 and the through-electrode 120 in each of, or at least one of, the through-holes H may be defined as a through-structure 125. For example, the through insulating pattern 122 may include at least one of silicon oxide, silicon nitride, or silicon oxynitride. The through-electrodes 120 may include poly-silicon doped with N-type or P-type dopants. The through insulating pattern 122 and/or the through-electrodes 120 may be formed with a chemical vapor deposition (CVD) process; however, inventive concepts are not limited thereto.

The formation of the through insulating patterns 122 and the through-electrodes 120 may include forming a through insulating layer (not shown) conformally covering inner surfaces of the through-holes H, forming preliminary through-electrodes (not shown) partially or fully filling the through-holes H, and performing an etch-back process (or a planarization process).

In some embodiments, the through-structure 125 may be formed to partially fill the through-hole H, as illustrated in FIG. 6D. In these embodiments, a filling insulation pattern 130 may be formed to fill a remaining portion of the through-hole H on each of, or at least one of, the through-structures 125. The formation of the filling insulation patterns 130 may include forming a filling insulation layer (not shown) filling the through-holes H and performing a planarization process on the filling insulation layer until the first surface 110a of the substrate 110 is exposed.

In some embodiments, the through-structures 125 may be formed to completely fill the through-holes H, as illustrated in FIG. 4C. In these embodiments, the formation of the filling insulation patterns 130 may be omitted.

First device isolation patterns DI may be formed in the substrate 110. Each of, or at least one of, the first device isolation patterns DI may be or may include a deep device isolation pattern that extends from the first surface 110a to the second surface 110b of the substrate 110.

Each of, or at least one of, the first device isolation patterns DI may include an extension DI_E extending in the first direction D1. The extensions DI_E may be between rows of the pixel regions PXR. One row consisting of the pixel regions PXR may be between the extensions DI_E of a pair of the first device isolation patterns DI adjacent to one another. For example, the extensions DI_E and the rows of the pixel regions PXR may be alternately arranged in the second direction D2.

Each of, or at least one of, the first device isolation patterns DI may further include protrusions DI_P that extend from the extension DI_E in parallel to the second direction D2. The protrusions DI_P may extend between the pixel regions PXR included in each of, or at least one of, adjacent rows.

Figure 6E:
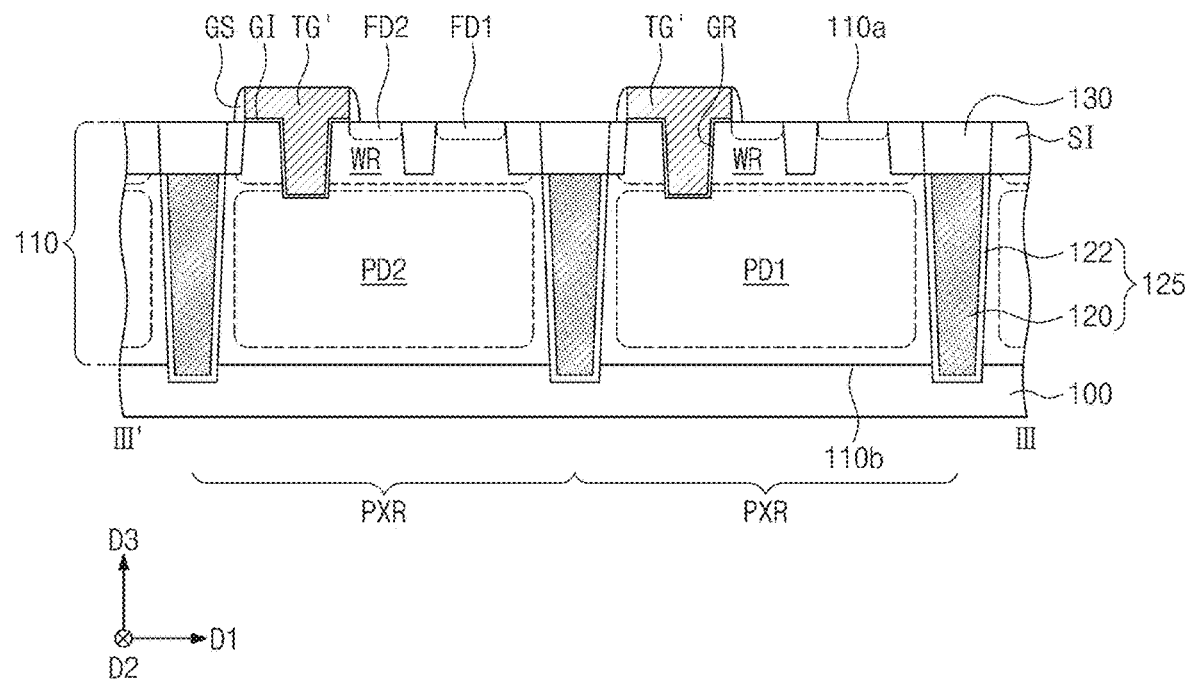

Referring to FIGS. 3 and 6E, transfer gates TG', source follower gates (not shown), reset gates (not shown), and selection gates (not shown) may be formed on the first surface 110a of the substrate 110.

The formation of the transfer gates TG' may include patterning the pixel regions PXR to form gate recess regions GR in the pixel regions PXR, respectively, forming a gate insulating layer (not shown) conformally covering inner surfaces of the gate recess regions GR and the first surface 110a of the substrate 110, forming a gate conductive layer (not shown) filling the gate recess regions GR, and patterning, for example sequentially patterning, the gate conductive layer and the gate insulating layer. The source follower gates, the reset gates, and the selection gates may also be formed by the process of patterning the gate conductive layer. Gate insulating patterns GI may be formed by the process of patterning the gate insulating layer. Next, gate spacers GS may be formed on sidewalls of the transfer gates TG' and sidewalls of the other gates.

A first floating diffusion region FD1 and a second floating diffusion region FD2 may be formed in the well dopant region WR of each of, or at least one of, the pixel regions PXR. The first and second floating diffusion regions FD1 and FD2 may be formed adjacent to the first surface 110a of the substrate 110. The second floating diffusion region FD2 may be formed at a side of a corresponding transfer gate TG', and the first floating diffusion region FD1 may be spaced apart from the second floating diffusion region FD2. The first and second floating diffusion regions FD1 and FD2 may be formed by injecting dopants of the second conductivity type into the well dopant regions WR. Source/drain regions adjacent to the source follower gates, the reset gates, and the selection gates may also be formed by the process of injecting the dopants of the second conductivity type.

Figure 6F:
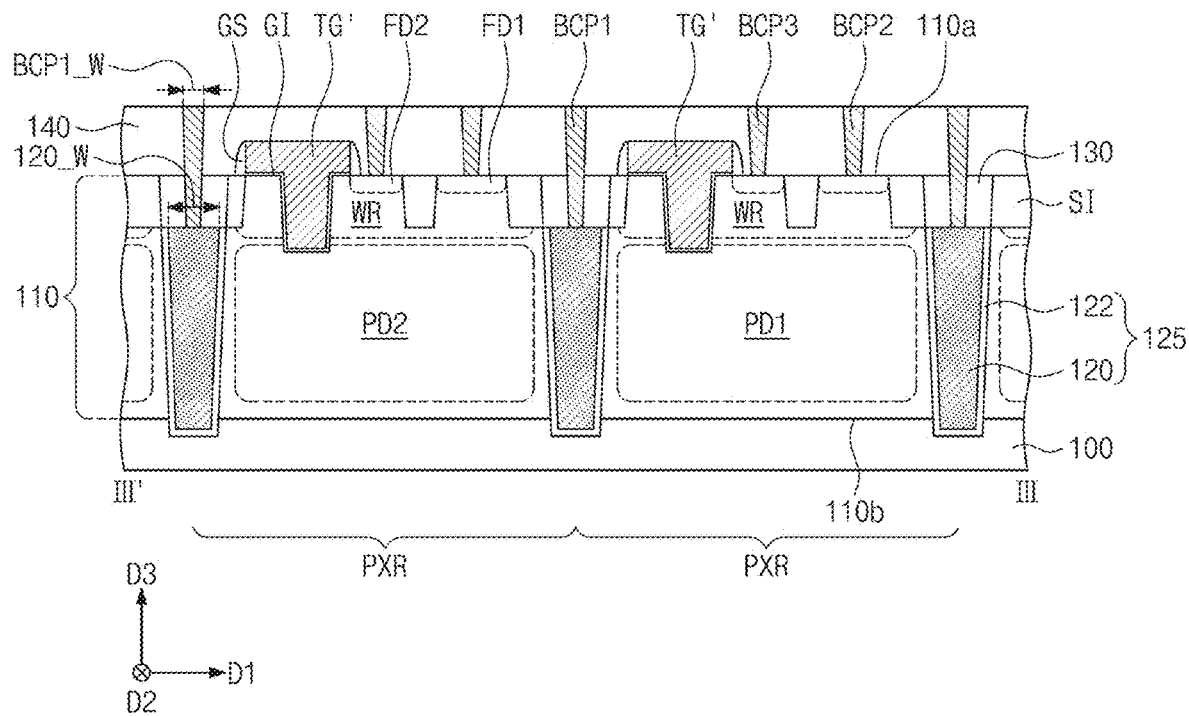

Referring to FIGS. 3 and 6F, a first interlayer insulating layer 140 may be formed to cover the first surface 110a of the substrate 110. The first interlayer insulating layer 140 may cover the gates (e.g., the transfer gates TG') formed on the first surface 110a of the substrate 110.

First bottom contact plugs BCP1 may be formed to penetrate the first interlayer insulating layer 140 and the filling insulation patterns 130. The first bottom contact plugs BCP1 may be connected to the through-electrodes 120, respectively. A width BCP1_W of each of, or at least one of, the first bottom contact plugs BCP1 may be smaller than a width 120_W of each of, or at least one of, the through-electrodes 120 when viewed in a cross-sectional view. The formation of the first bottom contact plugs BCP1 may include forming first bottom contact holes which penetrate the first interlayer insulating layer 140 and the filling insulation patterns 130 to expose the through-electrodes 120, forming a conductive layer (not shown) filling the first bottom contact holes, and performing a planarization process on the conductive layer until the first interlayer insulating layer 140 is exposed. The forming the conductive layer may include depositing a conductive material, such as a metal including tungsten, in the first bottom contact holes. The depositing of the metal may include deposition with a chemical vapor deposition (CVD) process; however, inventive concepts are not limited thereto.

Second bottom contact plugs BCP2 and third bottom contact plugs BCP3 may be formed to penetrate the first interlayer insulating layer 140. The second bottom contact plugs BCP2 may be connected to the first floating diffusion regions FD1, respectively, and the third bottom contact plugs BCP3 may be connected to the second floating diffusion regions FD2, respectively. The formation of the second and third bottom contact plugs BCP2 and BCP3 may include forming second and third bottom contact holes penetrating the first interlayer insulating layer 140 to expose the first and second floating diffusion regions FD1 and FD2, forming a conductive layer (not shown) filling the second and third bottom contact holes, and performing a planarization process on the conductive layer until the first interlayer insulating layer 140 is exposed.

The first to third bottom contact plugs BCP1, BCP2, and BCP3 may include a conductive material. For example, the first to third bottom contact plugs BCP1, BCP2, and BCP3 may include a metal (e.g., tungsten).

Lengths of the first bottom contact plugs BCP1 in the third direction D3 may be greater than lengths of the second bottom contact plugs BCP2 in the third direction D3 and lengths of the third bottom contact plugs BCP3 in the third direction D3.

In some embodiments, the first bottom contact plugs BCP1 may be formed by an additional process different from the process of forming the second and third bottom contact plugs BCP2 and BCP3. This may be because the lengths of the first bottom contact plugs BCP1 in the third direction D3 are greater than the lengths of the second bottom contact plugs BCP2 in the third direction D3 and the lengths of the third bottom contact plugs BCP3 in the third direction D3. However, embodiments of inventive concepts are not limited thereto. In some embodiments, the first bottom contact plugs BCP1 may be formed simultaneously with the second and third bottom contact plugs BCP2 and BCP3.

Figure 6G:
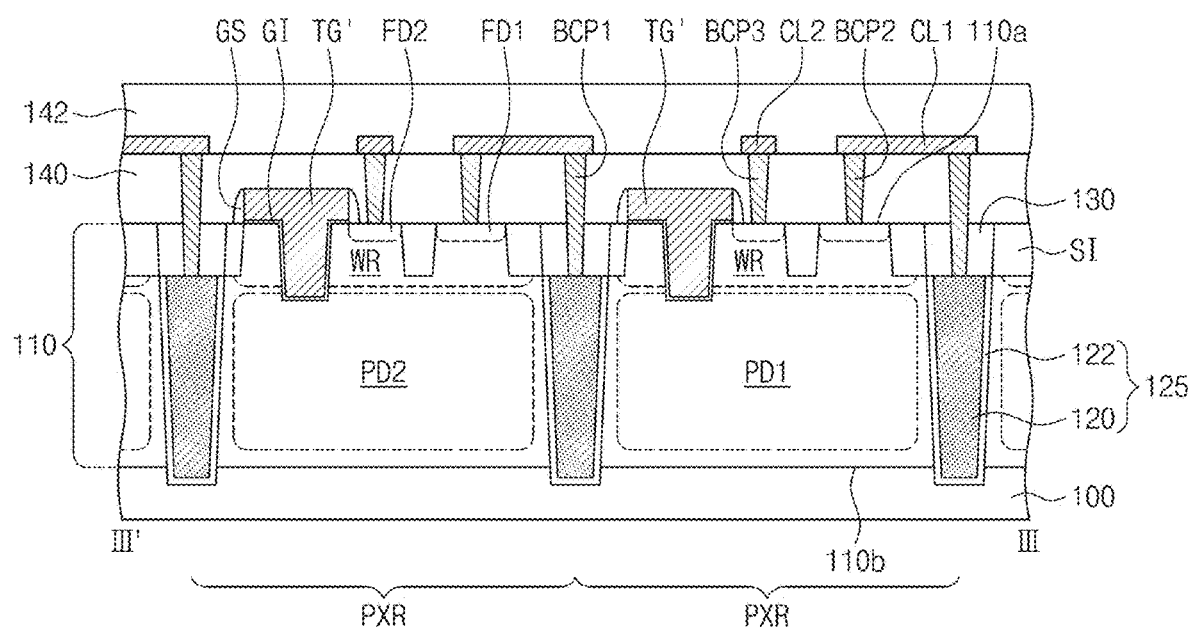
Figure 6G:
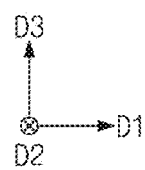

Referring to FIGS. 3 and 6G, interconnection lines CL1 and CL2 may be formed on the first interlayer insulating layer 140. The interconnection lines CL1 and CL2 may include first interconnection lines CL1 and second interconnection lines CL2. Each of, or at least one of, the first interconnection lines CL1 may connect a corresponding one of the first bottom contact plugs BCP1 to a corresponding one of the second bottom contact plugs BCP2, and each of, or at least one of, the second interconnection lines CL2 may be connected to a corresponding one of the third bottom contact plugs BCP3.

A second interlayer insulating layer 142 covering the interconnection lines CL1 and CL2 may be formed on the first interlayer insulating layer 140.

Figure 6H:
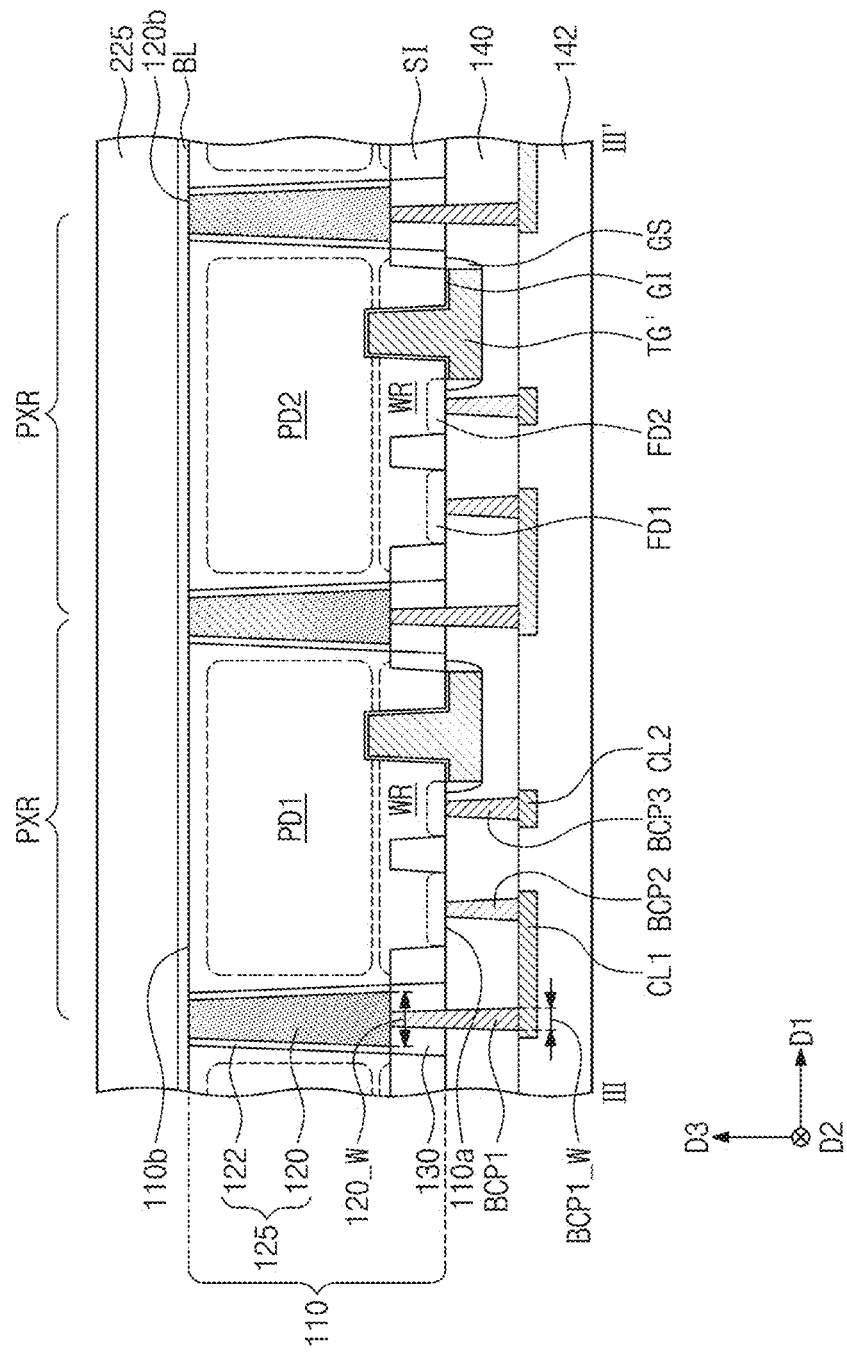

Referring to FIGS. 3 and 6H, a planarization process may be performed on the second surface 110b of the substrate 110. The planarization process may be performed until one end 120b of each of, or at least one of, the through-electrodes 120 is exposed. By the planarization process, the sacrificial substrate 100 may be removed and the second surface 110b of the substrate 110 may be exposed. Thus, the ends 120b of the through-electrodes 120 may be substantially coplanar with the second surface 110b of the substrate 110. The planarization process may be performed using a chemical mechanical polishing (CMP) process.

A buffer layer BL and an insulating layer 225 may be formed, for example sequentially formed, on the second surface 110b of the substrate 110. The buffer layer BL may include, for example, aluminum oxide and/or hafnium oxide. For example, the insulating layer 225 may include at least one of silicon oxide, silicon nitride, or silicon oxynitride.

Figure 6I:
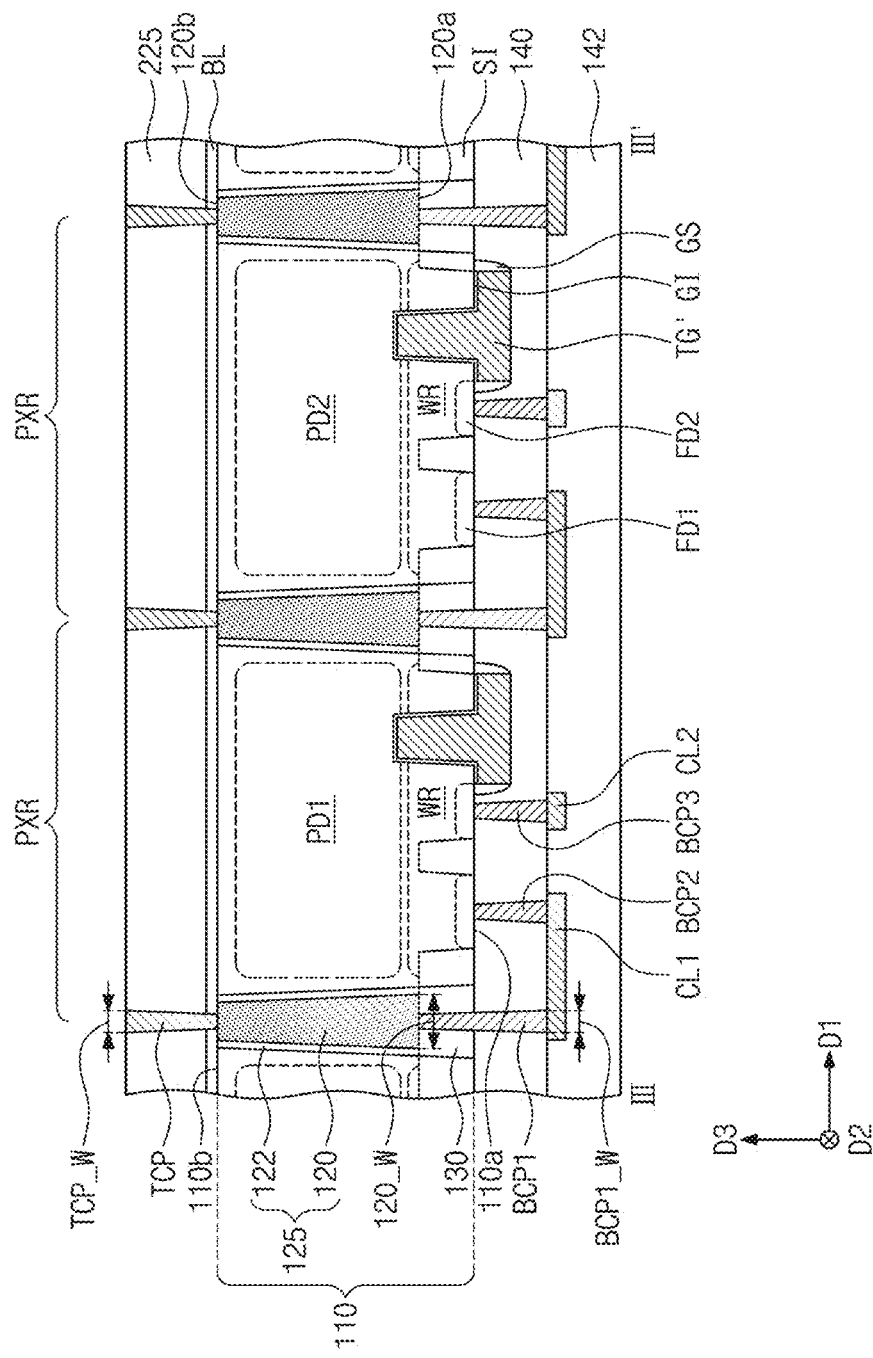

Referring to FIGS. 3 and 6I, top contact plugs TCP may be formed to penetrate the insulating layer 225 and the buffer layer BL. The top contact plugs TCP may be connected to the through-electrodes 120, respectively. A width TCP_W of each of, or at least one of, the top contact plugs TCP may be smaller than the width 120_W of each of, or at least one of, the through-electrodes 120 when viewed in a cross-sectional view. The formation of the top contact plugs TCP may include forming top contact holes which penetrate the insulating layer 225 and the buffer layer BL to expose the through-electrodes 120, forming a conductive layer (not shown) filling the top contact holes, and performing a planarization process on the conductive layer until the insulating layer 225 is exposed. For example, the top contact plugs TCP may include a metal (e.g., tungsten). The depositing of the conductive layer may include deposition with a chemical vapor deposition (CVD) process; however, inventive concepts are not limited thereto.

Figure 6J:
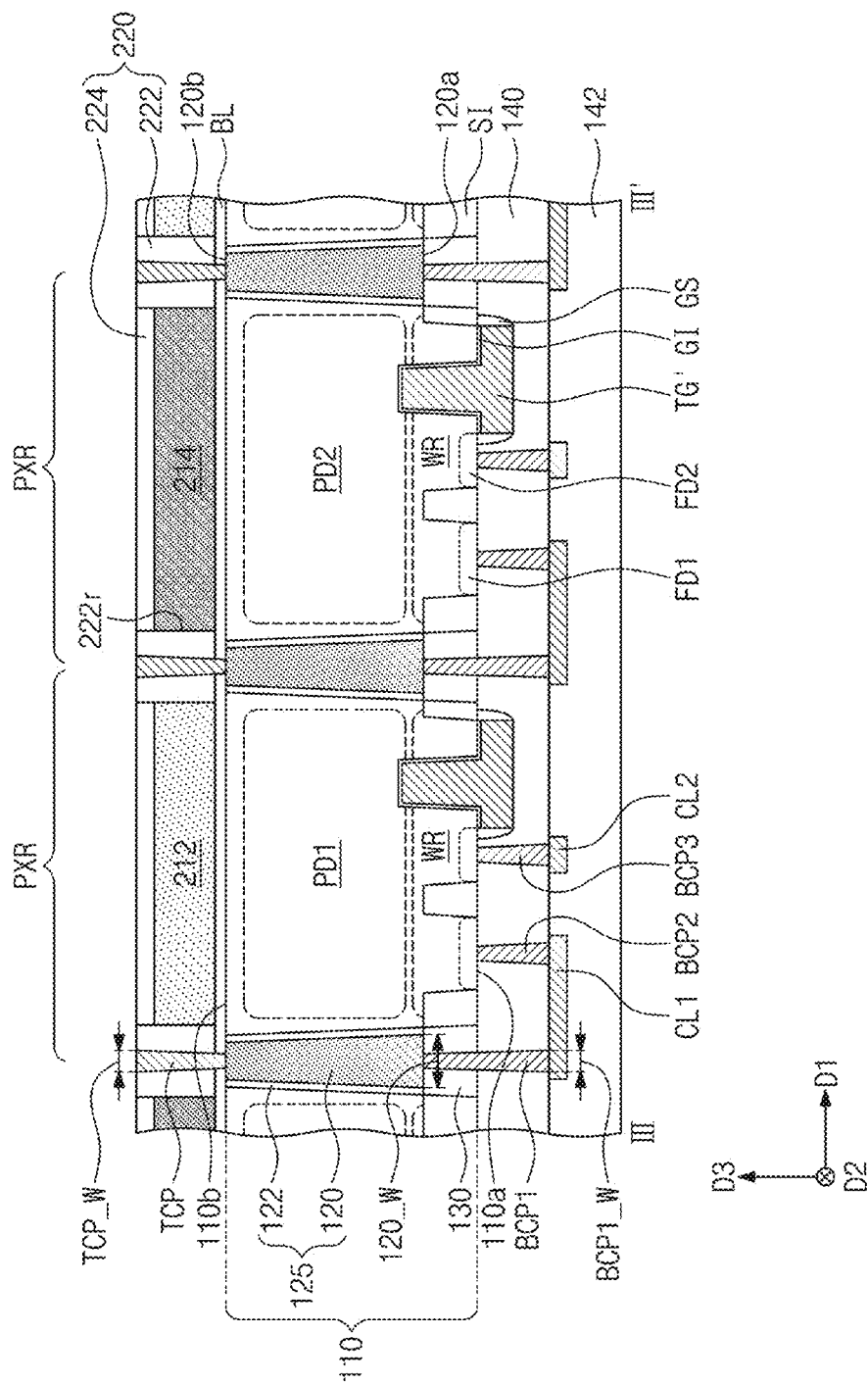

Referring to FIGS. 3 and 6J, color filters 212 and 214 may be formed to be buried in an insulating structure 220.

In more detail, the insulating layer 225 may be patterned to form a first insulating pattern 222 having recess regions 222r. The recess regions 222r of the first insulating pattern 222 may correspond to the pixel regions PXR of the substrate 110, respectively, when viewed in a plan view. The buffer layer BL may be exposed by the recess regions 222r.

The color filters 212 and 214 may be formed in the recess regions 222r, respectively. One of the first color filter 212 and the second color filter 214 may be formed in each of, or at least one of, the recess regions 222r. First color filters 212 may be formed to respectively correspond to the first photoelectric conversion regions PD1 in a plan view, and second color filters 214 may be formed to respectively correspond to the second photoelectric conversion regions PD2 in a plan view.

Second insulating patterns 224 may be formed on the color filters 212 and 214. The first insulating pattern 222 and the second insulating patterns 224 may be defined as the insulating structure 220. Thus, the color filters 212 and 214 may be buried in the insulating structure 220.

Figure 6K:
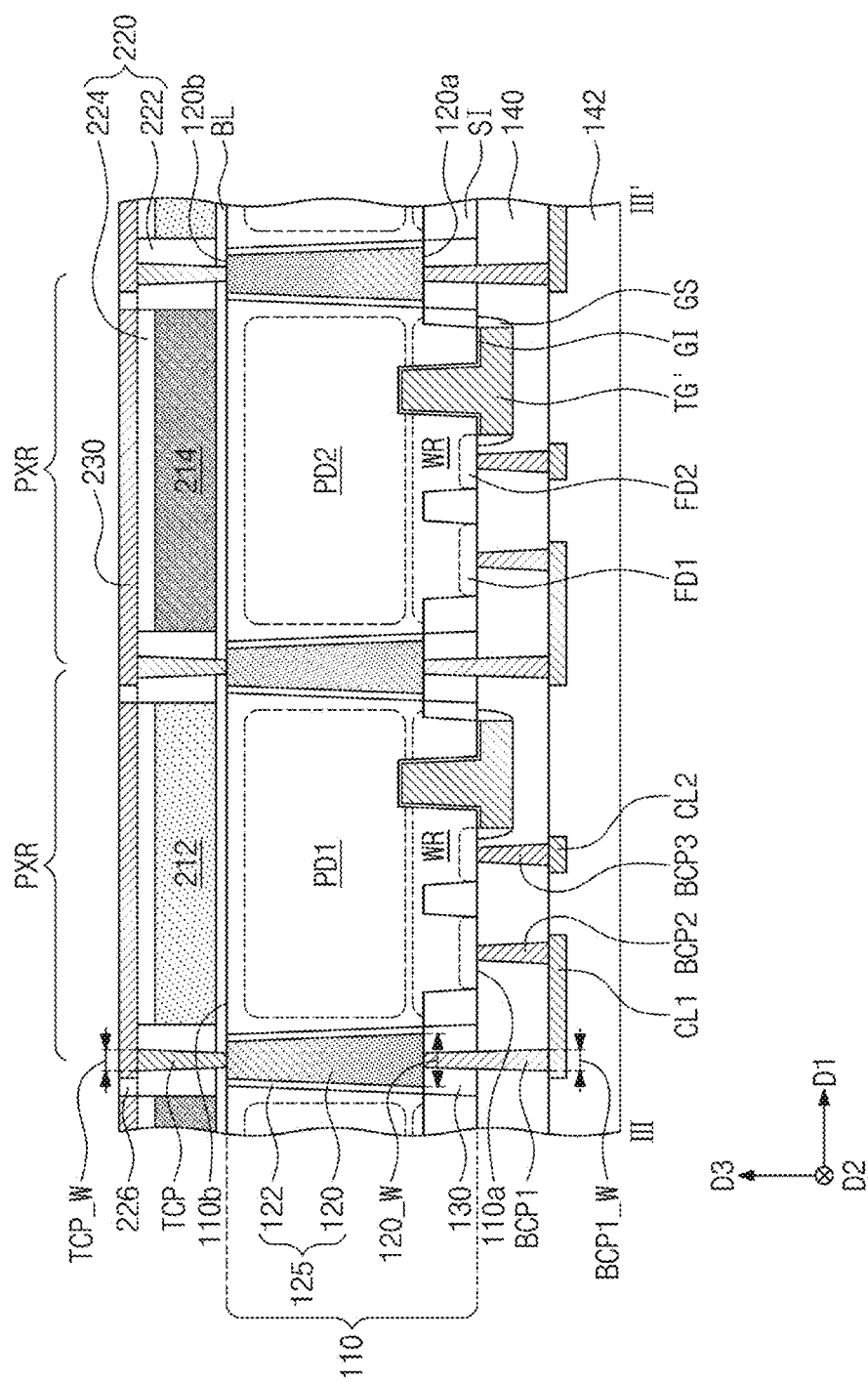

Referring to FIGS. 3 and 6K, bottom electrodes 230 may be formed on the insulating structure 220. The bottom electrodes 230 may be formed to correspond to the pixel regions PXR of the substrate 110, respectively, when viewed in a plan view. Each of, or at least one of, the bottom electrodes 230 may be connected to a corresponding one of the top contact plugs TCP. The formation of the bottom electrodes 230 may include forming a preliminary bottom electrode layer (not shown) on the insulating structure 220 and patterning the preliminary bottom electrode layer.

A third insulating pattern 226 may be formed to fill a gap between the bottom electrodes 230. The formation of the third insulating pattern 226 may include forming an insulating layer (not shown) filling the gap between the bottom electrodes 230 and performing a planarization process on the insulating layer until the bottom electrodes 230 are exposed.

Referring again to FIGS. 3 and 4A, the photoelectric conversion layer PD3, the top electrode 240, the capping layer 250, and the micro lenses 260 may be formed, for example sequentially formed, on the bottom electrodes 230.

According to some embodiments of inventive concepts, each of, or at least one of, the pixels of the image sensor may absorb two kinds of lights to generate two kinds of photoelectric signals.

According to some embodiments of inventive concepts, the top contact plugs may have relatively small widths. Thus, it is possible to secure a sufficient space, in which the color filters are buried, in the insulating structure.

As a result, according to some embodiments of inventive concepts, the integration density of the image sensor may be improved.

What is claimed is:

1. An image sensor comprising:
a substrate including a first surface and a second surface;
a first floating diffusion region disposed in the substrate;
a first insulating layer disposed on the first surface of the substrate;
a through structure disposed in the substrate, and including a through electrode and a through insulating pattern disposed on a sidewall of the through electrode, the through electrode being electrically connected to the first floating diffusion region;
a filling insulation pattern between the through electrode and the first surface;
an interconnection line disposed in the first insulating layer and electrically connected to the through electrode;
a first contact plug disposed in the first insulating layer, and electrically connected to the first floating diffusion region and the interconnection line;
a first photoelectric conversion region disposed in the substrate, and configured to generate charges from a first light having a first wavelength;
a second photoelectric conversion region disposed in the substrate, and configured to generate charges from a second light having a second wavelength;
a photoelectric conversion layer disposed on the second surface of the substrate, and configured to generate charges from a third light having a third wavelength; and
a first lens disposed on the photoelectric conversion layer,
wherein the photoelectric conversion layer is disposed on the first photoelectric conversion region and on the second photoelectric conversion region, and
wherein an outer sidewall of the through insulating pattern is flush with an outer sidewall of the filling insulation pattern.

2. The image sensor of claim 1, further comprising:
a first color filter disposed on the second surface of the substrate, and disposed on the first photoelectric conversion region; and a second color filter disposed on the second surface of the substrate, and disposed on the second photoelectric conversion region.

3. The image sensor of claim 1, wherein the first light has a red color,
the second light has a blue color, and
the third light has a green color.

4. The image sensor of claim 1, wherein the through electrode includes doped poly-silicon.

5. The image sensor of claim 1, wherein the through structure penetrate the substrate.

6. The image sensor of claim 1, further comprising:
a second insulating layer disposed on the second surface of the substrate; and
a second contact plug disposed in the second insulating layer, and electrically connected to the through electrode,
wherein a width of an upper portion of the second contact plug is greater than a width of a lower portion of the second contact plug, and
the lower portion of the second contact plug contacts the through electrode.

7. The image sensor of claim 1, further comprising a third contact plug disposed in the first insulating layer, and electrically connected to the through electrode and the interconnection line.

8. The image sensor of claim 1, further comprising a T-shaped transfer gate,
wherein a lower portion of the transfer gate is disposed in the substrate and an upper portion of the transfer gate protrudes from the first surface of the substrate.

9. An image sensor comprising:
a substrate including a first surface and a second surface;
a first floating diffusion region disposed in the substrate;
a first insulating layer disposed on the first surface of the substrate;
a second insulating layer disposed on the second surface of the substrate;
a through structure disposed in the substrate, and penetrating the substrate, the through structure including a through electrode and a through insulating pattern disposed on a sidewall of the through electrode, the through electrode being electrically connected to the first floating diffusion region;
an interconnection line disposed in the first insulating layer and electrically connected to the through electrode;
a first contact plug disposed in the first insulating layer, and electrically connected to the first floating diffusion region and the interconnection line;
a filling insulation pattern in the substrate and between the through electrode and the first surface;
a second contact plug completely penetrating the filling insulation pattern and contacting the through structure and the interconnection line;
a first photoelectric conversion region disposed in the substrate, and configured to generate charges from a first light having a first wavelength;
a second photoelectric conversion region disposed in the substrate, and configured to generate charges from a second light having a second wavelength;
a photoelectric conversion layer disposed on the second surface of the substrate, and configured to generate charges from a third light having a third wavelength;
a first lens disposed on the photoelectric conversion layer; and a first transistor shared by the first photoelectric conversion region and the second photoelectric conversion region,
wherein the photoelectric conversion layer is disposed on the first photoelectric conversion region and on the second photoelectric conversion region, and
the first contact plug contacts the first floating diffusion region and the interconnection line.

10. The image sensor of claim 9, wherein a gate of the first transistor is T-shaped,
a lower portion of the gate of the first transistor is disposed in the substrate, and
an upper portion of the gate of the first transistor protrudes from the first surface of the substrate.

11. The image sensor of claim 9, wherein the photoelectric conversion layer is shared by a plurality of pixels.

12. The image sensor of claim 9, wherein the substrate includes a plurality of pixel regions in which the first photoelectric conversion region and the second photoelectric conversion region are disposed, and
the through structure is disposed between two adjacent pixel regions among the plurality of pixel regions.

13. The image sensor of claim 9, further comprising a second transistor disposed in an active region, and shared by the first photoelectric conversion region, the second photoelectric conversion region and photoelectric conversion layer.

14. The image sensor of claim 9, further comprising:
a first color filter disposed on the second surface of the substrate, and disposed on the first photoelectric conversion region; and
a second color filter disposed on the second surface of the substrate, and disposed on the second photoelectric conversion region.

15. The image sensor of claim 9, further comprising:
a third contact plug disposed in the second insulating layer, and electrically connected to the through electrode,
wherein a width of an upper portion of the third contact plug is greater than a width of a lower portion of the third contact plug, and
the lower portion of the third contact plug contacts the through electrode.

16. An image sensor comprising:
a substrate including a first surface and a second surface, and including a plurality of pixel regions;
a plurality of pixels disposed in the plurality of pixel regions, and including a plurality of photodiodes;
a first floating diffusion region disposed in the substrate;
a first insulating layer disposed on the first surface of the substrate;
a second insulating layer disposed on the second surface of the substrate;
a plurality of through structures disposed in the substrate, and penetrating the substrate, each of the plurality of through structures including a through electrode and a through insulating pattern disposed on a sidewall of the through electrode, the through electrode being electrically connected to the first floating diffusion region;
an interconnection line disposed in the first insulating layer and electrically connected to the through electrode;
a first contact plug disposed in the first insulating layer, and electrically connected to the first floating diffusion region at a first level on a first plane parallel to the first surface and to the interconnection line;

a second contact plug in the first insulating layer, and electrically connected to the through electrode at a second level on a second plane parallel to the first surface, the second plane different from the first plane;

a first photoelectric conversion region disposed in the substrate, and configured to generate charges from a first light having a first wavelength;

a second photoelectric conversion region disposed in the substrate, and configured to generate charges from a second light having a second wavelength;

a photoelectric conversion layer disposed on the second surface of the substrate, and configured to generate charges from a third light having a third wavelength, the photoelectric conversion layer being shared by the plurality of pixels;

a first lens disposed on the photoelectric conversion layer; and a first transistor disposed in an active region, and shared by the first photoelectric conversion region, the second photoelectric conversion region and the photoelectric conversion layer, wherein the photoelectric conversion layer is disposed on the first photoelectric conversion region and on the second photoelectric conversion region.

17. The image sensor of claim 16, wherein each of the plurality of through structures is disposed between two adjacent pixels among the plurality of pixels.

18. The image sensor of claim 16, further comprising:
a first color filter disposed on the second surface of the substrate, and disposed on a first pixel among the plurality of pixels; and
a second color filter disposed on the second surface of the substrate, and disposed on a second pixel among the plurality of pixels.

19. The image sensor of claim 16, wherein the through electrode includes doped poly-silicon.

20. The image sensor of claim 16, wherein the first light has a red color,
the second light has a blue color, and
the third light has a green color.

* * * * *